US012635396B2

(12) United States Patent
Kim et al.

(10) Patent No.: US 12,635,396 B2
(45) Date of Patent: May 19, 2026

(54) DISPLAY PANEL WITH CORNER DISPLAY STRIPS

(71) Applicant: SAMSUNG DISPLAY CO., LTD., Yongin-si (KR)

(72) Inventors: Kyungmin Kim, Yongin-si (KR); Junhyeong Park, Yongin-si (KR); Jiyeon Seo, Yongin-si (KR); Hyoungsub Lee, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 1001 days.

(21) Appl. No.: 17/847,838

(22) Filed: Jun. 23, 2022

(65) Prior Publication Data

US 2023/0071192 A1 Mar. 9, 2023

(30) Foreign Application Priority Data

Sep. 9, 2021 (KR) ........................ 10-2021-0120534

(51) Int. Cl.
H10K 71/00 (2023.01)
H10K 59/80 (2023.01)

(52) U.S. Cl.
CPC ........... H10K 71/00 (2023.02); H10K 59/873 (2023.02)

(58) Field of Classification Search
CPC ...... H10K 71/00; H10K 71/135; H10K 71/10; H10K 59/121; H10K 2102/3035
See application file for complete search history.

(56) References Cited

U.S. PATENT DOCUMENTS

| | | | |
|---|---|---|---|
| 11,048,352 B2 | 6/2021 | Kim et al. | |
| 11,164,514 B2 | 11/2021 | Cho et al. | |
| 11,424,422 B2 | 8/2022 | Choi et al. | |
| 11,653,533 B2 | 5/2023 | Kim et al. | |
| 11,678,516 B2 | 6/2023 | Won et al. | |
| 12,101,988 B2 | 9/2024 | Park et al. | |
| 2020/0168824 A1 | 5/2020 | Park et al. | |
| 2020/0176696 A1* | 6/2020 | Dai ..................... | H10K 59/131 |
| 2021/0384465 A1 | 12/2021 | Park et al. | |

(Continued)

FOREIGN PATENT DOCUMENTS

| | | |
|---|---|---|
| CN | 112071883 A1 | 12/2020 |
| CN | 112133733 A | 12/2020 |
| KR | 1020200064231 A | 6/2020 |

(Continued)

*Primary Examiner* — Wasiul Haider

(74) *Attorney, Agent, or Firm* — CANTOR COLBURN LLP

(57) ABSTRACT

The invention relates to display panel, display device, and method of manufacturing display panel. The display panel includes an extended display area for displaying images. The display panel includes a substrate in which a main display area and a corner display area that is adjacent to a corner of the main display area are defined, and the substrate including a strip portion disposed in the corner display area and extending from the corner of the main display area in a first direction, a central portion disposed in the strip portion, and display elements arranged in a matrix in the first direction and a second direction crossing the first direction, in the central portion, where a trench is located between rows of the display elements in the central portion and extends in the second direction.

23 Claims, 18 Drawing Sheets

(56) References Cited

U.S. PATENT DOCUMENTS

| | | |
|---|---|---|
| 2022/0085327 A1 | 3/2022 | Kim et al. |
| 2023/0034664 A1 | 2/2023 | Shin et al. |

FOREIGN PATENT DOCUMENTS

| | | |
|---|---|---|
| KR | 1020200124352 A | 11/2020 |
| KR | 1020210018561 A | 2/2021 |
| KR | 1020210028783 A | 3/2021 |
| KR | 1020210034158 A | 3/2021 |
| KR | 1020210035959 A | 4/2021 |
| KR | 1020210149283 A | 12/2021 |
| KR | 1020210151634 A | 12/2021 |
| KR | 1020230019345 A | 2/2023 |

* cited by examiner

DISPLAY PANEL WITH CORNER DISPLAY STRIPS

This application claims priority to Korean Patent Application No. 10-2021-0120534, filed on Sep. 9, 2021, and all the benefits accruing therefrom under 35 U.S.C. § 119, the content of which in its entirety is herein incorporated by reference.

BACKGROUND

1. Field

Embodiments of the invention relate to a display panel, a display device, and a method of manufacturing the display panel.

2. Description of the Related Art

Mobile electronic devices have a wide range of uses. In addition to small electronic devices such as mobile phones, tablet personal computers ("PCs"), etc., are being widely used as the mobile electronic devices.

Such a mobile electronic device includes a display device to provide a user with various functions, for example, visual information such as images or video. Recently, as other components for driving a display device are being miniaturized, a proportion of display devices in electronic devices is gradually increasing, and a structure having two or more display areas extending at a certain angle is being developed.

SUMMARY

Embodiments of the invention provide a display panel with an extended display area for displaying images, a display device, and a method of manufacturing the display panel.

Additional features will be set forth in part in the description which follows and, in part, will be apparent from the description, or may be learned by practice of the presented embodiments.

In an embodiment of the invention, there is provided a display panel including a substrate in which a main display area and a corner display area that is adjacent to a corner of the main display area are defined, the substrate including a strip portion disposed in the corner display area and extending from the corner of the main display area in a first direction, a central portion disposed in the strip portion, and display elements arranged in a matrix in the first direction and a second direction crossing the first direction in the central portion, where a trench is located between rows of the display elements in the central portion and extends in the second direction.

In an embodiment, the display panel may further include a first dam disposed in the strip portion and surrounding at least a portion of the central portion.

In an embodiment, a first groove may be located between the central portion and the first dam and surround at least a portion of the central portion along the first dam, and the trench may extend from the first groove in the second direction.

In an embodiment, the trench may include a first trench and a second trench alternately defined with each other, the first groove may include a first portion and a second portion facing each other in the second direction, the first trench may extend from the first portion of the first groove, and the second trench may extend from the second portion of the first groove.

In an embodiment, a first hole and a second hole may be located between columns of the display elements in the central portion and extend in the first direction, the first trench may have a first end extended to the first portion of the first groove, and a second end extended to the first hole, and the second trench may have a third end extended to the second portion of the first groove, and a fourth end extended to the second hole.

In an embodiment, the display elements of one of the columns may be between the first hole and the second hole.

In an embodiment, the display panel may further include an organic encapsulation layer, at least a portion of which is buried in the first groove and the trench.

In an embodiment, the display panel may further include a second dam disposed in the strip portion and surrounding the first dam, and a second groove may be located between the first dam and the second dam and surround the first dam along the second dam.

In an embodiment, a third groove may be extended to the first groove and the second groove.

In an embodiment, the trench and the third groove may be on the same line.

In an embodiment, the first dam may include a plurality of sub-dams spaced apart from each other, and the third groove may be defined between the plurality of sub-dams.

In an embodiment, the display panel may further include an organic encapsulation layer, at least a portion of which is buried in the first groove, the second groove, the third groove, and the trench.

In an embodiment, a width of the central portion in the second direction may be greater than a length of the trench in the second direction.

In an embodiment, the trench may be provided in plural to include a plurality of trenches, and the display elements of one of the rows may be between the plurality of trenches.

In an embodiment, the strip portion may be provided in plural to include a plurality of strip portions, and the plurality of strip portions may be spaced apart from each other.

In an embodiment of the invention, there is provided a method of manufacturing a display panel including providing a substrate in which a main display area and a corner display area that is adjacent to a corner of the main display area are defined, the substrate including a strip portion disposed in the corner display area and extending from the corner of the main display area in a first direction, forming a central portion in the strip portion, forming display elements arranged in a matrix in the first direction and a second direction crossing the first direction in the central portion, alternately defining a plurality of first trenches and a plurality of second trenches extending in the second direction between rows of the display elements in the central portion, and directly injecting organic droplets into a portion of each of the plurality of first trenches and a portion of each of the plurality of second trenches.

In an embodiment, the method of manufacturing a display panel may further include defining a first groove surrounding at least a portion of the central portion in the strip portion, and the plurality of first trenches and the plurality of second trenches may extend from the first groove in the second direction.

In an embodiment, the organic droplets may fill the first groove along the plurality of first trenches and the plurality of second trenches.

In an embodiment, the first groove may include a first portion and a second portion facing each other in the second direction, the plurality of first trenches may extend from the first portion of the first groove, and the plurality of second trenches may extend from the second portion of the first groove.

In an embodiment, the method of manufacturing a display panel may further include defining a second groove surrounding the first groove in the strip portion.

In an embodiment, the method of manufacturing a display panel may further include defining a plurality of third grooves extended to the first groove and the second groove, and each of the plurality of third grooves may be on the same line as at least one of the plurality of first trenches and the plurality of second trenches.

In an embodiment, the organic droplets may be filled in the first groove and the second groove along the plurality of first trenches and the plurality of second trenches.

In an embodiment of the invention, there is provided a display device including a display panel and a cover window configured to cover the display panel, wherein the display panel includes a substrate in which a main display area and a corner display area that is adjacent to a corner of the main display area and bent with a preset radius of curvature are defined, the substrate including a strip portion disposed in the corner display area and extending from the corner of the main display area in a first direction, a central portion disposed in the strip portion, and display elements arranged in a matrix in the first direction and a second direction crossing the first direction in the central portion, and where a trench is located between rows of the display elements in the central portion and extends in the second direction.

In an embodiment, the display panel may further include a first dam disposed in the strip portion and surrounding at least a portion of the central portion, and a first groove may be located between the central portion and the first dam and surround at least a portion of the central portion along the first dam, and the trench may extend from the first groove in the second direction.

In an embodiment, the trench may include a first trench and a second trench alternately defined with each other, the first groove may include a first portion and a second portion facing each other in the second direction, the first trench may extend from the first portion of the first groove, and the second trench may extend from the second portion of the first groove.

In an embodiment, the display panel may further include an organic encapsulation layer, at least a portion of which is buried in the first groove and the trench.

In an embodiment, the display panel may further include a second dam disposed in the strip portion and surrounding the first dam, and a second groove may be located between the first dam and the second dam and surround the first dam along the second dam.

In an embodiment, a third groove may be extended to the first groove and the second groove and located on the same line as the trench.

In an embodiment, the display panel may further include an organic encapsulation layer, at least a portion of which is buried in the first groove, the second groove, the third groove, and the trench.

In an embodiment, the strip portion may be provided in plural to include a plurality of strip portions, and the plurality of strip portions may be spaced apart from each other.

These and/or other features will become apparent and more readily appreciated from the following description of the embodiments, taken in conjunction with the accompanying drawings.

These embodiments may be implemented by a system, a method, a computer program, or any combinations thereof.

BRIEF DESCRIPTION OF THE DRAWINGS

The above and other features and advantages of embodiments of the invention will be more apparent from the following description taken in conjunction with the accompanying drawings, in which:

FIG. 8 is a cross-sectional view of the strip portion of FIG. 6 taken along line VII-VII' of FIG. 6;

FIG. 9 is a cross-sectional view of the strip portion of FIG. 6 taken along line VIII-VIII' of FIG. 6;

FIGS. 10 to 12 are views sequentially illustrating an embodiment of a method of manufacturing a display panel;

FIG. 16 is a cross-sectional view of the strip portion of FIG. 15 taken along line IX-IX' of FIG. 15;

FIG. 17 is a cross-sectional view of the strip portion of FIG. 6 taken along line VII-VII' of FIG. 6; and FIG. 18 is a cross-sectional view of the strip portion of FIG. 6 taken along line VIII-VIII' of FIG. 6.

DETAILED DESCRIPTION

Figure 1:
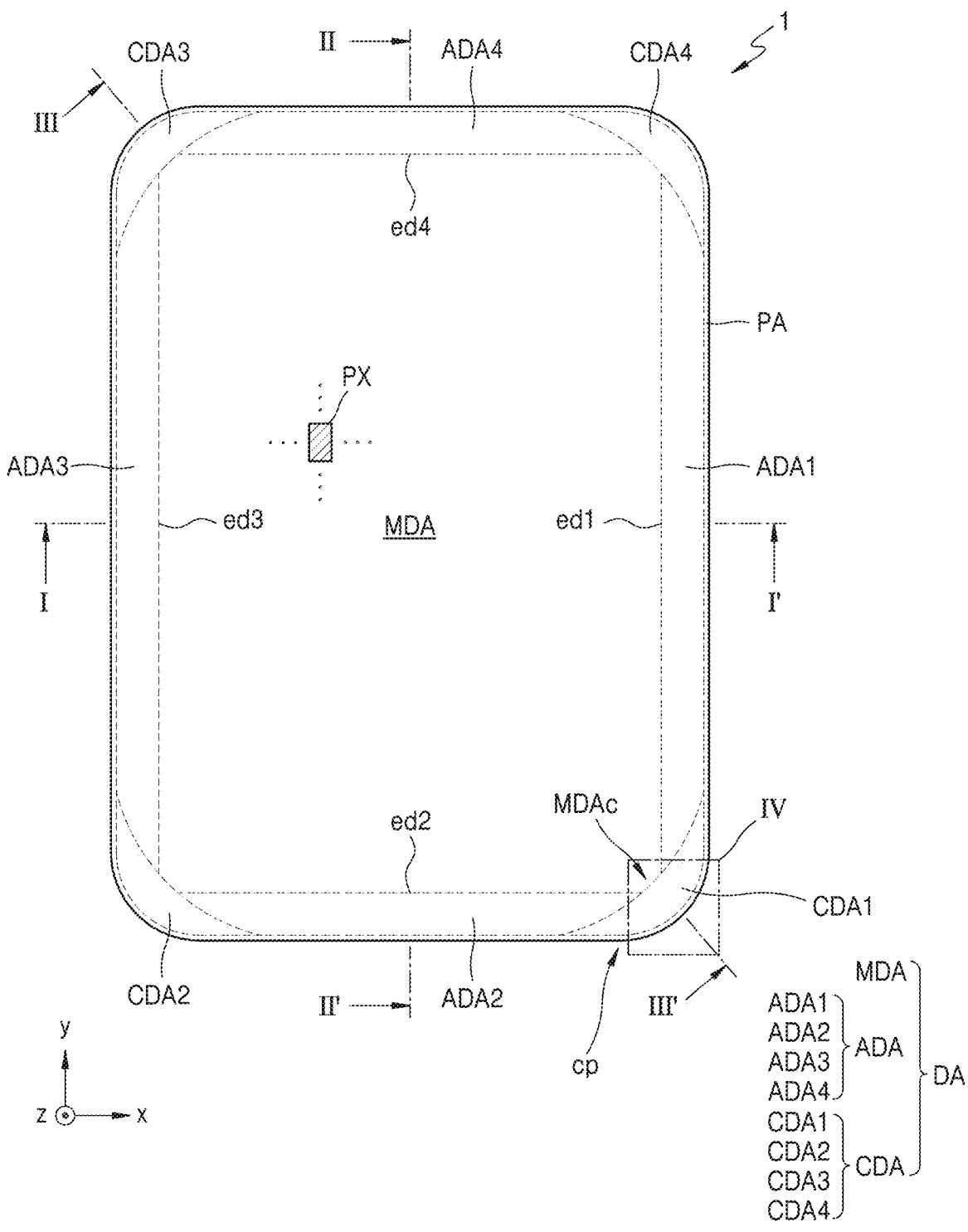
FIG. 1 is a plan view of an embodiment of a display device.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

Since the invention may have diverse modified embodiments, certain embodiments are illustrated in the drawings and are described in the detailed description. Advantages and features of the invention, and implementation methods thereof will be clarified through following embodiments described with reference to the accompanying drawings.

The invention may, however, be embodied in many different forms and should not be construed as limited to the embodiments set forth herein.

Reference will now be made in detail to embodiments, examples of which are illustrated in the accompanying drawings, where like reference numerals refer to like elements throughout, and repeated description thereof will be omitted.

It will be understood that although the terms "first," "second," etc., may be used herein to describe various elements, these elements should not be limited by these terms.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or component is referred to as being "disposed on" another layer, region, or component, it can be directly or indirectly disposed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. Two consecutively described processes may be performed substantially at the same time or performed in an order opposite to the described order, for example.

In the specification, the term "A and/or B" refers to the case of A or B, or A and B. In the specification, the term "at least one of A and B" refers to the case of A or B, or A and B.

It will be understood that when a layer, region, or component is connected to another portion, the layer, region, or component may be directly connected to the portion, and/or an intervening layer, region, or component may exist, such that the layer, region, or component may be indirectly connected to the portion. When a layer, region, or component is electrically connected to another portion, the layer, region, or component may be directly electrically connected to the portion and/or may be indirectly connected to the portion through another layer, region, or component, for example.

An x-axis, a y-axis and a z-axis are not limited to three axes of the rectangular coordinate system and may be interpreted in a broader sense. The x-axis, the y-axis, and the z-axis may be perpendicular to one another, or may represent different directions that are not perpendicular to one another, for example.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 2:
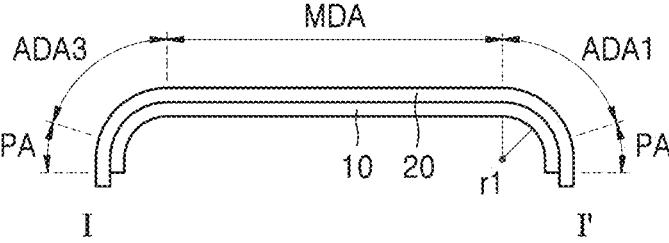
FIG. 2 is a cross-sectional view of the display device of FIG. 1 taken along line I-I' of FIG. 1.
Figure 2:
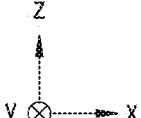
Figure 3:
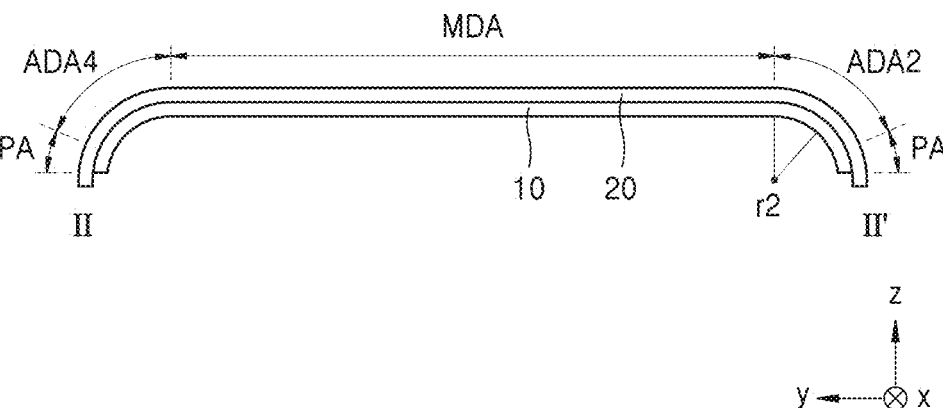
FIG. 3 is a cross-sectional view of the display device of FIG. 1 taken along line II-II' of FIG. 1.
Figure 4:
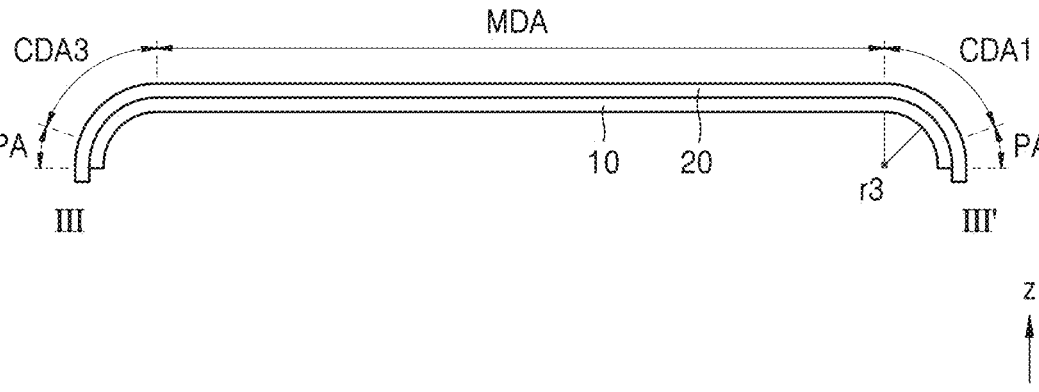
FIG. 4 is a cross-sectional view of the display device of FIG. 1 taken along line III-III' of FIG. 1.

FIG. 1 is a plan view of an embodiment of a display device. FIG. 2 is a cross-sectional view of the display device of FIG. 1 taken along line I-I' of FIG. 1, FIG. 3 is a cross-sectional view of the display device of FIG. 1 taken along line II-II' of FIG. 1, and FIG. 4 is a cross-sectional view of the display device of FIG. 1 taken along line III-III' of FIG. 1.

Referring to FIG. 1, a display device 1 is a device that displays moving images or still images, and may be used as a display screen of various products such as a television, a laptop computer, a monitor, a billboard, or the internet of things ("IOT") device, as well as portable electronic devices such as a mobile phone, a smartphone, a tablet personal computer ("PC"), a mobile communication terminal, an electronic notebook, an e-book, a portable multimedia player ("PMP"), a navigation, or an ultra-mobile PC ("UMPC").

The display device 1 may be used in a wearable device such as a smart watch, a watch phone, a spectacle-type display, or a head mounted display ("HMD"). In addition, the display device 1 may be used as a dashboard of a vehicle, a center information display ("CID") placed on a center fascia or a dashboard of a vehicle, a room mirror display that replaces side mirrors of a vehicle, and a display on a rear surface of a front seat as entertainment for a rear seat of a vehicle.

The display device 1 may include a long side in a first direction and a short side in a second direction. The first direction and the second direction may be directions crossing each other. In an embodiment, the first direction and the second direction may define an acute angle with each other, for example. In another embodiment, the first direction and the second direction may define an obtuse angle or a right angle to each other. Hereinafter, a case in which the first direction (e.g., ±y direction) and the second direction (e.g., ±x direction) are perpendicular to each other will be described in detail.

In another embodiment, a length of a side of the display device 1 in the first direction (e.g., ±y direction) may be the same as a length of a side of the display device 1 in the second direction (e.g., ±x direction). In another embodiment, the display device 1 may include a short side in the first direction (e.g., ±y direction) and a long side in the second direction (e.g., ±x direction).

An edge where a long side in the first direction (e.g., ±y direction) and a short side in the second direction (e.g., ±x direction) meet may be rounded to have a predetermined curvature.

Referring to FIGS. 2 to 4, the display device 1 may include a display panel 10 and a cover window 20. The cover window 20 may protect the display panel 10. Although not shown in FIGS. 2 to 4, a panel protective member may be under the display panel 10. The panel protective member may protect a lower surface of the display panel 10.

The cover window 20 may be a flexible window. The cover window 20 may protect the display panel 10 while being easily bent according to an external force without occurrence of a crack or the like. The cover window 20 may include glass, sapphire, or plastic. In an embodiment, the cover window 20 may include ultra-thin glass (UTG®) or colorless polyimide ("CPI"), for example. In an embodiment, the cover window 20 may have a structure in which a flexible polymer layer is disposed on one surface of a glass substrate, or may consist of a polymer layer.

The display panel 10 may be under the cover window 20. Although not shown in FIGS. 2 to 4, the display panel 10 may be attached to the cover window 20 by at least one of an optical clear resin ("OCR"), an optical clear adhesive ("OCA"), and a pressure sensitive adhesive ("PSA").

The display panel 10 may be an organic light-emitting display panel including a display element of which brightness varies with current, for example, an organic light-emitting diode ("OLED"). In an alternative embodiment, the display panel 10 may be an inorganic light-emitting display panel (or an inorganic electroluminescent display panel) or a quantum dot light-emitting display panel. That is, a light-emitting layer of the display element included in the display panel 10 may include an organic material, an inorganic material, quantum dots, organic material and quantum dots, inorganic material and quantum dots, or organic material and inorganic material and quantum dots.

The display panel 10 may include a display area DA displaying an image and a peripheral area PA surrounding the display area DA. The display area DA may include a plurality of pixels PX, and an image may be displayed through the plurality of pixels PX. Each of the plurality of pixels PX may include sub-pixels. In an embodiment, each of the plurality of pixels PX may include a red sub-pixel, a green sub-pixel, and a blue sub-pixel. In an alternative embodiment, each of the plurality of pixels PX may include a red sub-pixel, a green sub-pixel, a blue sub-pixel, and a white sub-pixel, for example.

The display area DA may include a main display area MDA, an auxiliary display area ADA, and a corner display area CDA. Each of the main display area MDA, the auxiliary display area ADA, and the corner display area CDA may include the plurality of pixels PX, and the plurality of pixels PX may display an image.

In an embodiment, the plurality of pixels PX respectively arranged in the main display area MDA, the auxiliary display area ADA, and the corner display area CDA may provide independent images, for example. In another embodiment, the plurality of pixels PX respectively arranged in the main display area MDA, the auxiliary display area ADA and the corner display area CDA may provide portions of any one image.

The main display area MDA is a flat display area and may include a pixel PX including a display element. The main display area MDA may provide most of the images.

A pixel PX including a display element may also be disposed in the auxiliary display area ADA. The auxiliary display area ADA may display an image by the pixel PX. The auxiliary display area ADA may include a first auxiliary display area ADA1, a second auxiliary display area ADA2, a third auxiliary display area ADA3, and a fourth auxiliary display area ADA4. In another embodiment, at least one of the first auxiliary display area ADA1, the second auxiliary display area ADA2, the third auxiliary display area ADA3, and the fourth auxiliary display area ADA4 may be omitted.

The first auxiliary display area ADA1 and the third auxiliary display area ADA3 may be extended from the main display area MDA in the second direction (e.g., the ±x direction). In an embodiment, the first auxiliary display area ADA1 may be extended from the main display area MDA in the +x direction, and the third auxiliary display area ADA3 may be extended from the main display area MDA in the −x direction, for example. The first auxiliary display area ADA1 may be extended from a first edge ed1 of the main display area MDA, and the third auxiliary display area ADA3 may be extended from a third edge ed3 of the main display area MDA.

The first auxiliary display area ADA1 and the third auxiliary display area ADA3 may have an arbitrary radius of curvature and may be bent. In an embodiment, the first auxiliary display area ADA1 and the third auxiliary display area ADA3 may have different radii of curvature from each other, for example. In another embodiment, the first and third auxiliary display areas ADA1 and ADA3 may have the same radius of curvature as each other. Hereinafter, a case in which the first auxiliary display area ADA1 and the third auxiliary display area ADA3 have the same radius of curvature as a first radius of curvature r1 will be described in detail. In addition, because the first auxiliary display area ADA1 and the third auxiliary display area ADA3 are similar to each other, the first auxiliary display area ADA1 will be mainly described in detail.

The second auxiliary display area ADA2 and the fourth auxiliary display area ADA4 may be extended from the main display area MDA in the first direction (e.g., the ±y direction). In an embodiment, the second auxiliary display area ADA2 may be extended from the main display area MDA in the −y direction, and the fourth auxiliary display area ADA4 may be extended from the main display area MDA in the +y direction, for example. The second auxiliary display area ADA2 may be extended from a second edge ed2 of the main display area MDA, and the fourth auxiliary display area ADA4 may be extended from a fourth edge ed4 of the main display area MDA.

The second auxiliary display area ADA2 and the fourth auxiliary display area ADA4 may have an arbitrary radius of curvature and may be bent. In an embodiment, the second auxiliary display area ADA2 and the fourth auxiliary display area ADA4 may have different radii of curvature from each other, for example. In another embodiment, the second auxiliary display area ADA2 and the fourth auxiliary display area ADA4 may have the same radius of curvature as each other. Hereinafter, a case in which the second auxiliary display area ADA2 and the fourth auxiliary display area ADA4 have the same radius of curvature as a second radius of curvature r2 will be described in detail. In addition, because the second auxiliary display area ADA2 and the fourth auxiliary display area ADA4 are similar to each other, the second auxiliary display area ADA2 will be mainly described in detail.

In an embodiment, the first radius of curvature r1 of the first auxiliary display area ADA1 may be different from the second radius of curvature r2 of the second auxiliary display area ADA2. In an embodiment, the first radius of curvature r1 may be less than the second radius of curvature r2, for example. In another embodiment, the first radius of curvature r1 may be greater than the second radius of curvature r2.

In another embodiment, the first radius of curvature r1 of the first auxiliary display area ADA1 may be the same as the second radius of curvature r2 of the second auxiliary display area ADA2. Hereinafter, a case in which the first radius of curvature r1 is less than the second radius of curvature r2 will be mainly described in detail.

The corner display area CDA may extend from a corner MDAc of the main display area MDA and be bent. The corner display area CDA may correspond to a corner portion cp. The corner portion cp is a corner of the display area DA, and may be a portion where a long side of the display area DA in the first direction (e.g., the ±y direction) meets a short side of the display area DA in the second direction (e.g., the ±x direction).

The corner display areas CDA may be between neighboring auxiliary display areas ADA. In an embodiment, a first corner display area CDA1 may be between the first auxiliary display area ADA1 and the second auxiliary display area ADA2. A second corner display area CDA2 may be between the second auxiliary display area ADA2 and the third auxiliary display area ADA3, for example. A third corner display area CDA3 may be between the third auxiliary display area ADA3 and the fourth auxiliary display area ADA4. A fourth corner display area CDA4 may be between the fourth auxiliary display area ADA4 and the first auxiliary display area ADA1.

The corner display area CDA may be extended to the neighboring auxiliary display areas ADA. In an embodiment, the first corner display area CDA1 may extended to the first auxiliary display area ADA1 and the second auxiliary display area ADA2, for example. The second corner display area CDA2 may be extended to the second auxiliary display area ADA2 and the third auxiliary display area ADA3. The third corner display area CDA3 may be extended to the third auxiliary display area ADA3 and the fourth auxiliary display area ADA4. The fourth corner display area CDA4 may be extended to the fourth auxiliary display area ADA4 and the first auxiliary display area ADA1.

As such, the auxiliary display area ADA and the corner display area CDA may be arranged to surround the main display area MDA, and may each be bent to have an arbitrary radius of curvature.

A third radius of curvature r3 of the corner display area CDA may be plural. The corner display area CDA may have a plurality of third radii of curvature r3. In other words, the third radius of curvature r3 of the corner display area CDA may vary. In an embodiment, the plurality of third radii of curvature r3 of the corner display area CDA may correspond to arbitrary radii of curvature within a vector sum (r1+r2) of the first radius of curvature r1 of the first auxiliary display area ADA1 and the second radius of curvature r2 of the second auxiliary display area ADA2, respectively, for example. In other words, the third radius of curvature r3 may vary within the vector sum (r1+r2) of the first radius of curvature r1 and the second radius of curvature r2.

In the illustrated embodiment, the display device 1 may display an image not only in the main display area MDA but also in the auxiliary display area ADA and the corner display area CDA. Accordingly, the proportion of the display area DA in the display device 1 may increase. In addition, the display device 1 may be bent at a corner and may include the corner display area CDA for displaying an image, thereby improving aesthetics.

Although it has been described so far that the display panel 10 is bent at the first radius of curvature r1, the second radius of curvature r2, and the third radius of curvature r3, the same may be applied to the cover window 20.

Figure 5:
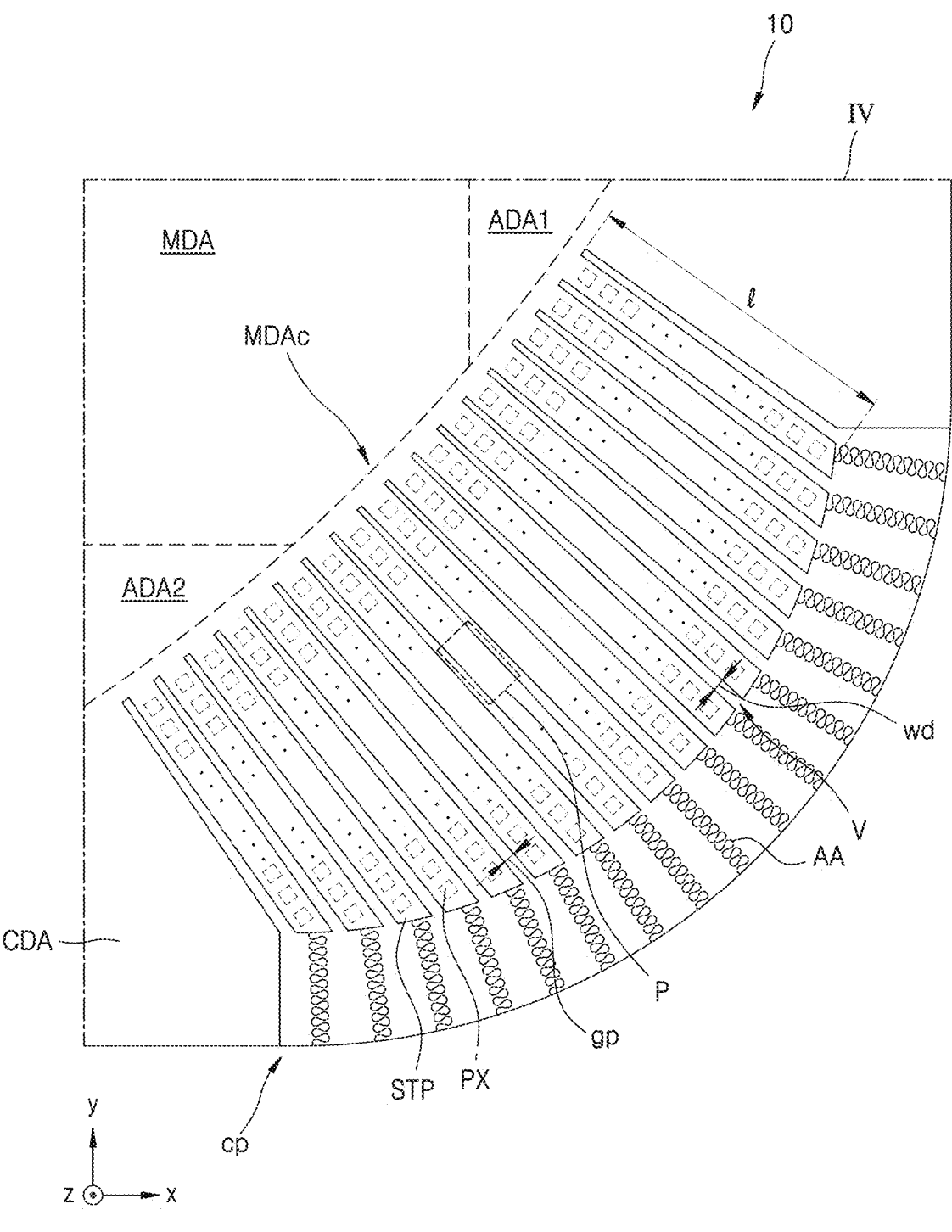
FIG. 5 is an enlarged plan view of an embodiment of a portion IV of a display panel.

FIG. 5 is an enlarged plan view of an embodiment of a portion IV of the display panel 10. In more detail, FIG. 5 is an enlarged plan view of the first corner display area CDA1 of the display panel 10. Hereinafter, description will be made based on the first corner display area CDA1, but the same may be applied to the second to fourth corner display areas CDA2, CDA3, and CDA4.

Referring to FIG. 5, the display panel 10 may include a plurality of strip portions STP and a plurality of auxiliary portions AA, and a plurality of penetration portions V corresponding to the first corner display area CDA1 may be defined in the display panel 10.

The plurality of strip portions STP may extend from the corner MDAc of the main display area MDA. In other words, the strip portions STP may extend from the corner MDAc of the main display area MDA to the corner portion cp of the display panel 10. In other words, the strip portions STP may extend from the main display area MDA toward the first corner display area CDA1.

A length l of each of the strip portions STP may be different from each other. The lengths l of the plurality of strip portions STP may be different according to a distance at which each of the strip portions STP is spaced apart from the center of the first corner display area CDA1. In an embodiment, a length of each of the strip portions STP disposed at the center from among the plurality of strip portions STP may be greater than a length of each of the other strip portions STP, for example. As a separation distance between the center of the first corner display area CDA1 and a strip portion STP increases, the length l of the strip portion STP may decrease.

In FIG. 5, the strip portions STP are respectively shown to have different lengths l, but in another embodiment, the length l of each of the strip portions STP may be the same.

The strip portions STP may be arranged to be spaced apart from each other at a predetermined gap gp. The gap gp between the strip portions STP may vary. In an embodiment, the gap gp between the strip portions STP may increase from the main display area MDA to the first corner display area CDA1, for example. The gap gp between the strip portions STP may gradually increase as the distance from the corner MDAc of the main display area MDA increases. The strip portions STP may be radially arranged.

In FIG. 5, the strip portions STP are shown to be radially arranged, but in another embodiment, the gap gp between the strip portions STP may not vary but may be constant. In other words, the strip portions STP may be arranged parallel to each other.

The plurality of penetration portions V may be defined by the strip portions STP. As described above, the strip portions STP may be arranged to be spaced apart from each other with a predetermined gap gp, and empty spaces defined between the strip portions STP may be referred to as the penetration portions V, respectively. The penetration portions V may be between the strip portions STP.

Because the penetration portions V correspond to the empty spaces between the strip portions STP, a width wd of a penetration portion V may correspond to the gap gp between the strip portions STP. The width wd of the penetration portion V may vary. In an embodiment, the width wd of the penetration portion V may increase from the main display area MDA to the first corner display area CDA1, for example. The width wd of the penetration portion V may gradually increase as the penetration portion V is farther away from the corner MDAc of the main display area MDA.

FIG. 5 shows that the width wd of the penetration portion V is variable, but in another embodiment, the width wd of the penetration portion V may be constant rather than being variable.

The penetration portions V may pass through a front surface and a lower surface of the display panel 10, respectively. The penetration portions V may reduce a weight of the display panel 10 and improve flexibility of the display panel 10. In addition, when an external force (forces such as bending, pulling, etc.) is applied to the display panel 10, stress generation during deformation of the display panel 10 may be easily reduced by changing shapes of the penetration portions V, thereby preventing abnormal deformation of the display panel 10 and improving durability. Accordingly, user convenience may be improved when an electronic device including the display panel 10 is used, and the display panel 10 may be easily applied to a wearable device.

When an external force is applied to the display panel 10, the width wd, area, or shape of the penetration portion V may be changed, and the location of the strip portion STP may be changed. In an embodiment, when a force bending edges of the display panel 10 and corners therebetween is applied, the gap gp between the strip portions STP may be reduced, and the width wd or the area of the penetration portion V may also be reduced, for example.

As such, when an external force is applied to the display panel 10, the gap gp between the strip portions STP and the width wd or area of the penetration portions V may change, and shapes of the strip portions STP may not change. Although the pixel PX including a pixel circuit and a display element, various wires, etc., may be arranged in the strip portions STP, the shape of the strip portions STP do not change even when an external force is applied to the display panel 10, so the pixel PX, various wires, etc., arranged in the strip portions STP may be protected. The pixels PX may also be arranged in the first corner display area CDA1 having a curvature, and the display area DA (refer to FIG. 1) may extend from the main display area MDA to the first corner display area CDA1.

The plurality of auxiliary portions AA may be connected to respective ends of the strip portions STP. The auxiliary portions AA may extend in a direction away from the main display area MDA. The auxiliary portions AA may prevent adjacent strip portions STP from sticking to each other when the gap gp between the strip portions STP is changed by an external force applied to the display panel 10. The auxiliary portions AA are respectively connected to the strip portions STP, and each of the auxiliary portions AA may hold a corresponding strip portion STP from among the plurality of strip portions STP. When an external force is applied to the display panel 10, adjacent strip portions STP do not stick to each other through the auxiliary portions AA, and only the gap gp between the strip portions STP may be reduced.

Figure 6:
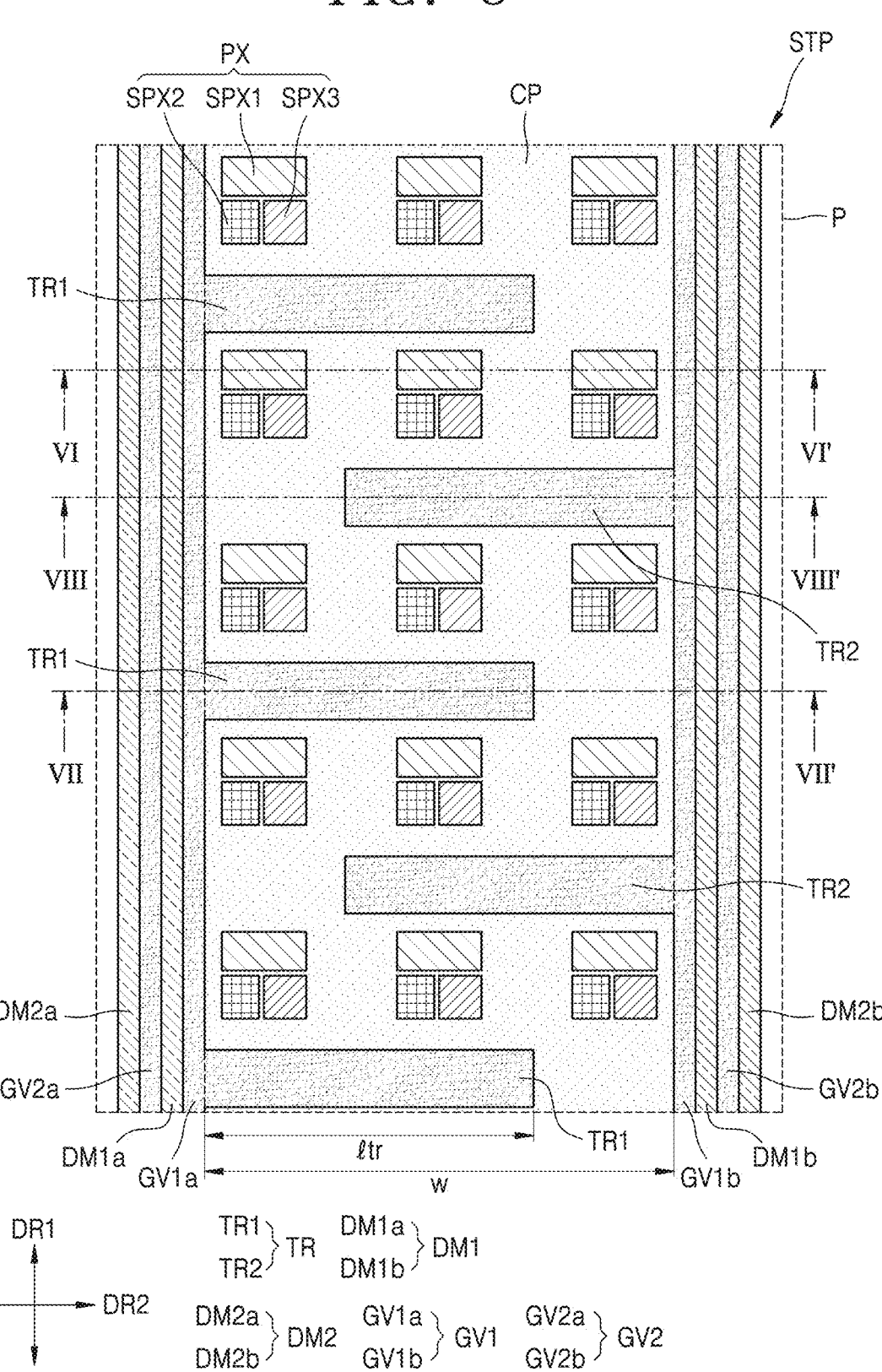
FIG. 6 is an enlarged plan view of a portion P of FIG. 5.

FIG. 6 is an enlarged plan view of a portion P of FIG. 5. In more detail, FIG. 6 is an enlarged plan view of a portion of the strip portion STP extending in a first direction DR1 from the corner MDAc of the main display area MDA. As shown in FIG. 5, the strip portion STP is plural, and the first direction DR1 may be defined differently to correspond to the strip portions STP, respectively. In an embodiment, the first direction DR1 may be defined as a longitudinal direction of each of the strip portions STP, for example. Hereinafter, one strip portion STP will be described as a reference, but the same may be applied to other strip portions STP.

Referring to FIG. 6, a central portion CP, pixels PX, a first dam DM1, a first groove GV1, at least one trench TR, a second dam DM2, and a second groove GV2 may be arranged in the strip portion STP.

The central portion CP may be disposed in a central area of the strip portion STP. The central portion CP may include insulating patterns as will be described later with reference to FIG. 7.

The pixels PX may be arranged in a matrix in the first direction DR1 and a second direction DR2 in the central portion CP. The pixels PX may include display elements, respectively, and the display elements may be arranged in a matrix in the first direction DR1 and the second direction DR2 in the central portion CP.

Each of the pixels PX may include a first sub-pixel SPX1, a second sub-pixel SPX2, and a third sub-pixel SPX3. The first sub-pixel SPX1, the second sub-pixel SPX2, and the third sub-pixel SPX3 may emit light of different colors. In an embodiment, the first sub-pixel SPX1 may emit green light, the second sub-pixel SPX2 may emit red light, and the third sub-pixel SPX3 may emit blue light, for example.

The first sub-pixels SPX1 may be arranged in a matrix in the first direction DR1 and the second direction DR2 in the central portion CP. The first sub-pixels SPX1 may include first display elements, respectively, and the first display elements may be arranged in a matrix in the first direction DR1 and the second direction DR2 in the central portion CP.

The second sub-pixels SPX2 may be arranged in a matrix in the first direction DR1 and the second direction DR2 in the central portion CP. The second sub-pixels SPX2 may include second display elements, respectively, and the second display elements may be arranged in a matrix in the first direction DR1 and the second direction DR2 in the central portion CP.

The third sub-pixels SPX3 may be arranged in a matrix in the first direction DR1 and the second direction DR2 in the central portion CP. The third sub-pixels SPX3 may include third display elements, respectively, and the third display elements may be arranged in a matrix in the first direction DR1 and the second direction DR2 in the central portion CP.

Each of the pixels PX includes first to third display elements arranged in a preset pattern. The first to third display elements included in one pixel PX may be individually referred to as display elements or collectively referred to as display elements, depending on context. In the former case, the first, second, or third display elements may be arranged in a matrix in the first direction DR1 and the second direction DR2 corresponding to the first, second, or third sub-pixels SPX1, SPX2, or SPX3, respectively. In the latter case, the display elements may be arranged in a matrix in the first direction DR1 and the second direction DR2 corresponding to the pixels PX.

FIG. 6 illustrates that each of the pixels PX includes three sub-pixels, but in another embodiment, each of the pixels PX may include three or more sub-pixels. In an embodiment, each of the pixels PX may include four sub-pixels, for example. In addition, FIG. 6 illustrates that the sub-pixels of each of the pixels PX are arranged in a stripe structure, but in another embodiment, the sub-pixels of each of the pixels PX may be arranged in various shapes, such as a mosaic arrangement structure or a delta arrangement structure.

FIG. 6 illustrates that the pixels PX are arranged in three columns, but in another embodiment, the pixels PX may be arranged in one column, two columns, or three or more columns.

The first dam DM1 may surround at least a portion of the central portion CP. In an embodiment, a first portion DM1a of the first dam DM1 may surround at least one side of the central portion CP, and a second portion DM1b of the first dam DM1 may at least partially surround the other side of the central portion CP, for example. The first portion DM1a of the first dam DM1 and the second portion DM1b of the first dam DM1 may face each other in the second direction DR2. The first dam DM1 may include insulating patterns as will be described later with reference to FIG. 7.

The first groove GV1 may be between the central portion CP and the first dam DM1. The first groove GV1 may surround at least a portion of the central portion CP along the first dam DM1. In an embodiment, a first portion GV1a of the first groove GV1 may at least partially surround one side of the central portion CP along the first portion DM1a of the first dam DM1, for example. A second portion GV1*b* of the first groove GV1 may at least partially surround the other side of the central portion CP along the second portion DM1*b* of the first dam DM1. The first portion GV1*a* of the first groove GV1 and the second portion GV1*b* of the first groove GV1 may face each other in the second direction DR2.

Trenches TR may be located between rows of the pixels PX in the central portion CP and may extend in the second direction DR2. In an embodiment, one row of pixels PX may be between the trenches TR, for example.

FIG. 6 illustrates that one row of pixels PX is between the trenches TR, but in another embodiment, one or more rows of the pixels PX may be between the trenches TR. In an embodiment, two rows of the pixels PX may be between the trenches TR, for example.

The trenches TR may extend from the first groove GV1 in the second direction DR2. The trenches TR may extend from one of the first portion GV1*a* of the first groove GV1 and the second portion GV1*b* of the first groove GV1 facing each other in the second direction DR2. In an embodiment, first trenches TR1 from among the plurality of trenches TR may extend from the first portion GV1*a* of the first groove GV1, and second trenches TR2 from among the plurality of trenches TR may extend from the second portion GV1*b* of the first groove GV1, for example. The first trenches TR1 and the second trenches TR2 may be alternately defined with each other.

Figure 11:
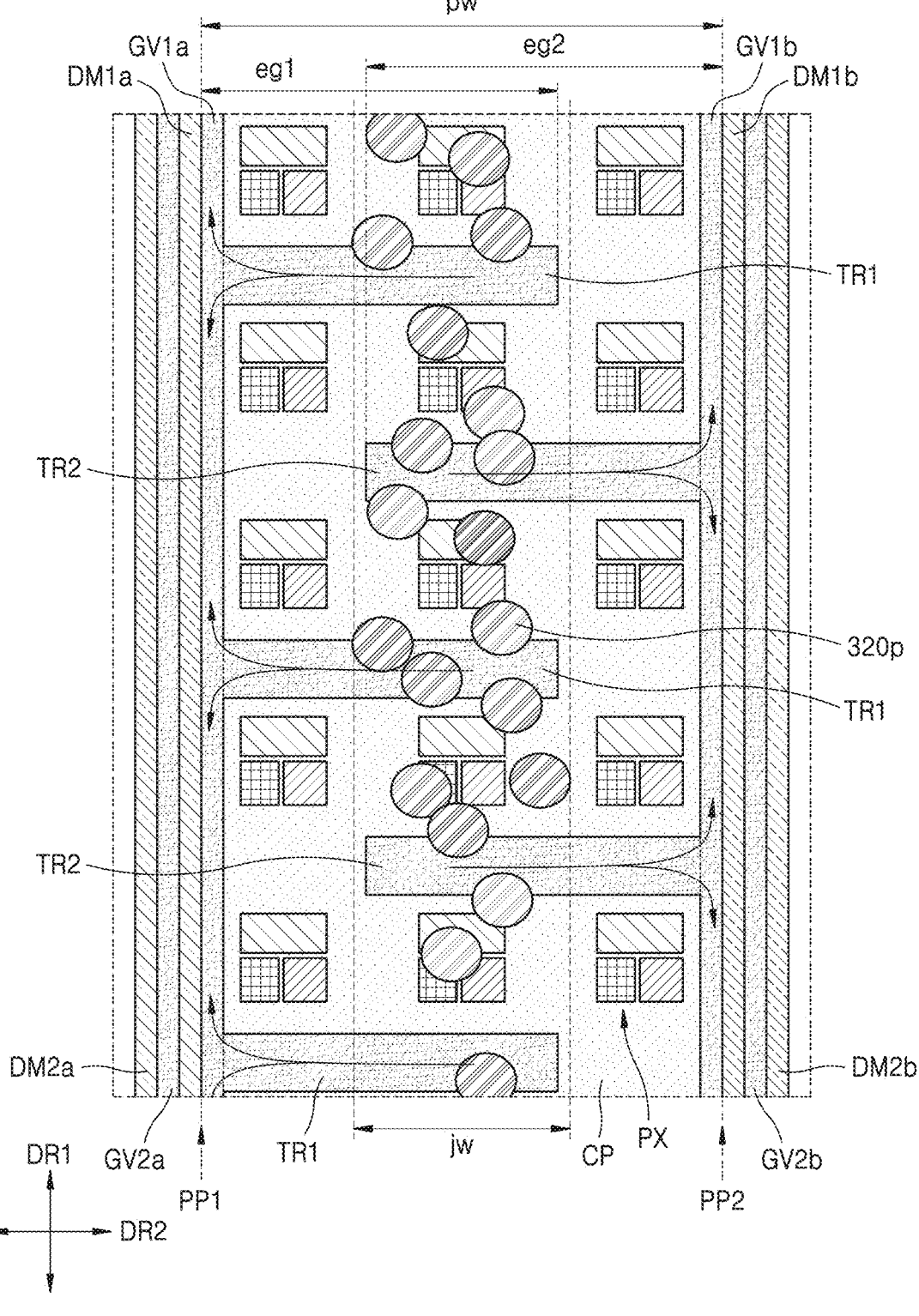

As such, when the trenches TR are located in the central portion CP, as shown in FIG. 11 to be described later below, when organic droplets 320*p* are injected into a portion of the central portion CP, the organic droplets 320*p* may be directly injected into a portion of the trenches TR. The organic droplets 320*p* may gradually fill the first groove GV1 along the trenches TR. Because the organic droplets 320*p* may move along a path formed or provided by the trenches TR, the flow of the organic droplets 320*p* may be controlled. Therefore, it is possible to prevent the organic droplets 320*p* from flowing irregularly, such as overflowing the first dam DM1, and as a result, it is possible to prevent irregular ends of an organic encapsulation layer 320 (refer to FIG. 7) from being formed or disposed in each of the strip portions STP.

A length ltr of the trench TR in the second direction DR2 may be less than a width w of the central portion CP in the second direction DR2. When the length ltr of the trench TR is less than the width w of the central portion CP, an opposite electrode 230 (refer to FIG. 7) may be in the central portion CP, and the opposite electrode 230 may extend substantially in the first direction DR1 along the central portion CP. Accordingly, the pixels PX arranged in the same strip portion STP may share the opposite electrode 230 with each other.

FIG. 6 illustrates that the length ltr of the trench TR is less than the width w of the central portion CP, but in another embodiment, the length ltr of the trench TR may be substantially the same as the width w of the central portion CP. In this case, the opposite electrode 230 may include a plurality of electrodes spaced apart from each other and arranged for each pixel row. The plurality of electrodes may be connected to each other through separate wires.

The second dam DM2 may surround at least a portion of the first dam DM1. In an embodiment, a first portion DM2*a* of the second dam DM2 may surround the first portion DM1*a* of the first dam DM1, and a second portion DM2*b* of the second dam DM2 may surround the second portion DM1*b* of the first dam DM1, for example. The first portion DM2*a* of the second dam DM2 and the second portion DM2*b* of the second dam DM2 may face each other in the second direction DR2. The second dam DM2 may include insulating patterns as will be described later with reference to FIG. 7.

The second groove GV2 may be between the first dam DM1 and the second dam DM2. The second groove GV2 may surround at least a portion of the first dam DM1 along the second dam DM2. In an embodiment, a first portion GV2*a* of the second groove GV2 may surround the first portion DM1*a* of the first dam DM1 along the first portion DM2*a* of the second dam DM2, for example. A second portion GV2*b* of the second groove GV2 may surround the second portion DM1*b* of the first dam DM1 along the second portion DM2*b* of the second dam DM2. The first portion GV2*a* of the second groove GV2 and the second portion GV2*b* of the second groove GV2 may face each other in the second direction DR2.

FIG. 6 illustrates that the second dam DM2 is disposed and the second groove GV2 are defined in the strip portion STP, but in another embodiment, the second dam DM2 and the second groove GV2 may be omitted.

Figure 7:
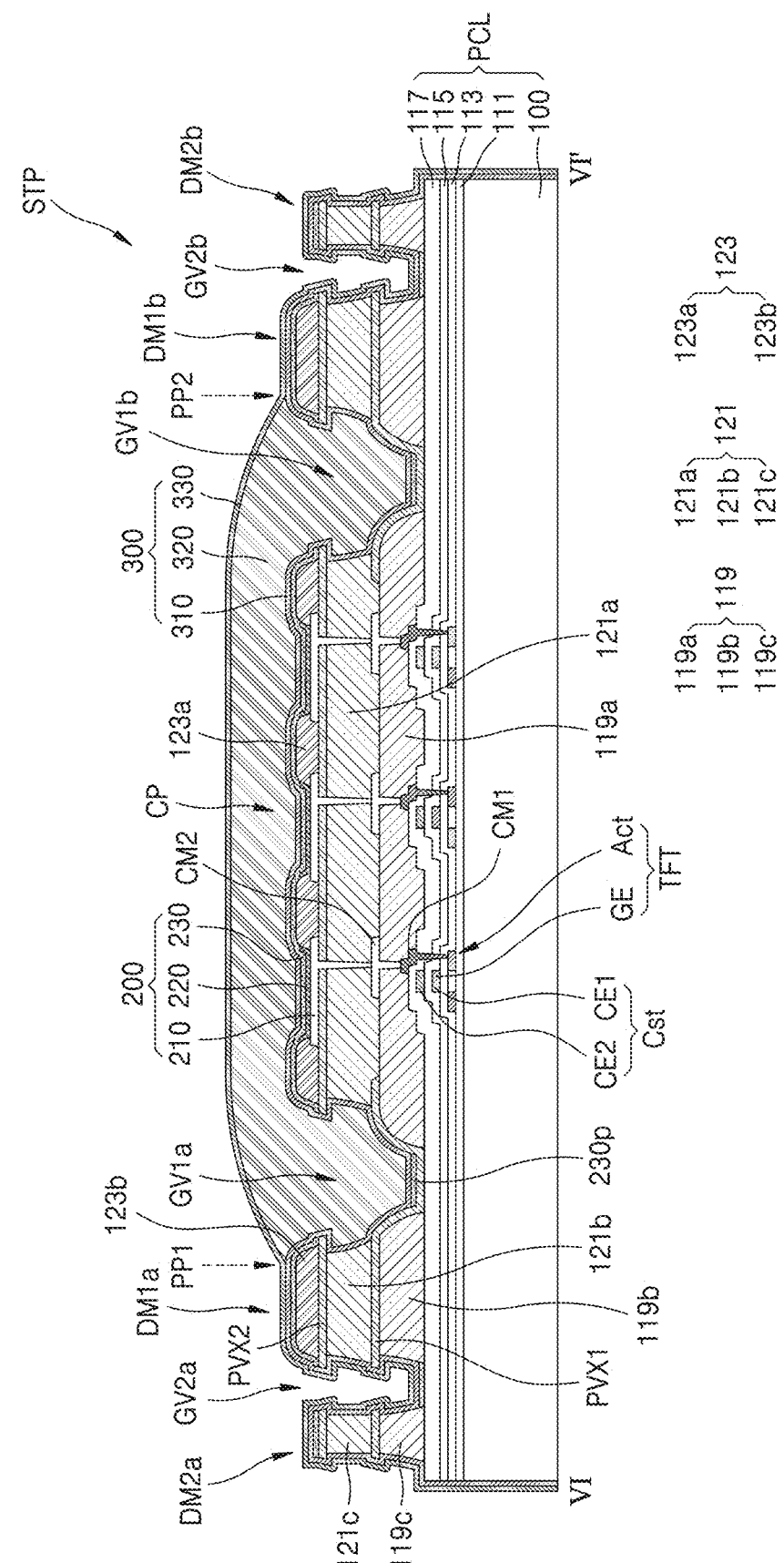
FIG. 7 is a cross-sectional view of a strip portion of FIG. 6 taken along line VI-VI' of FIG. 6.
Figure 8:
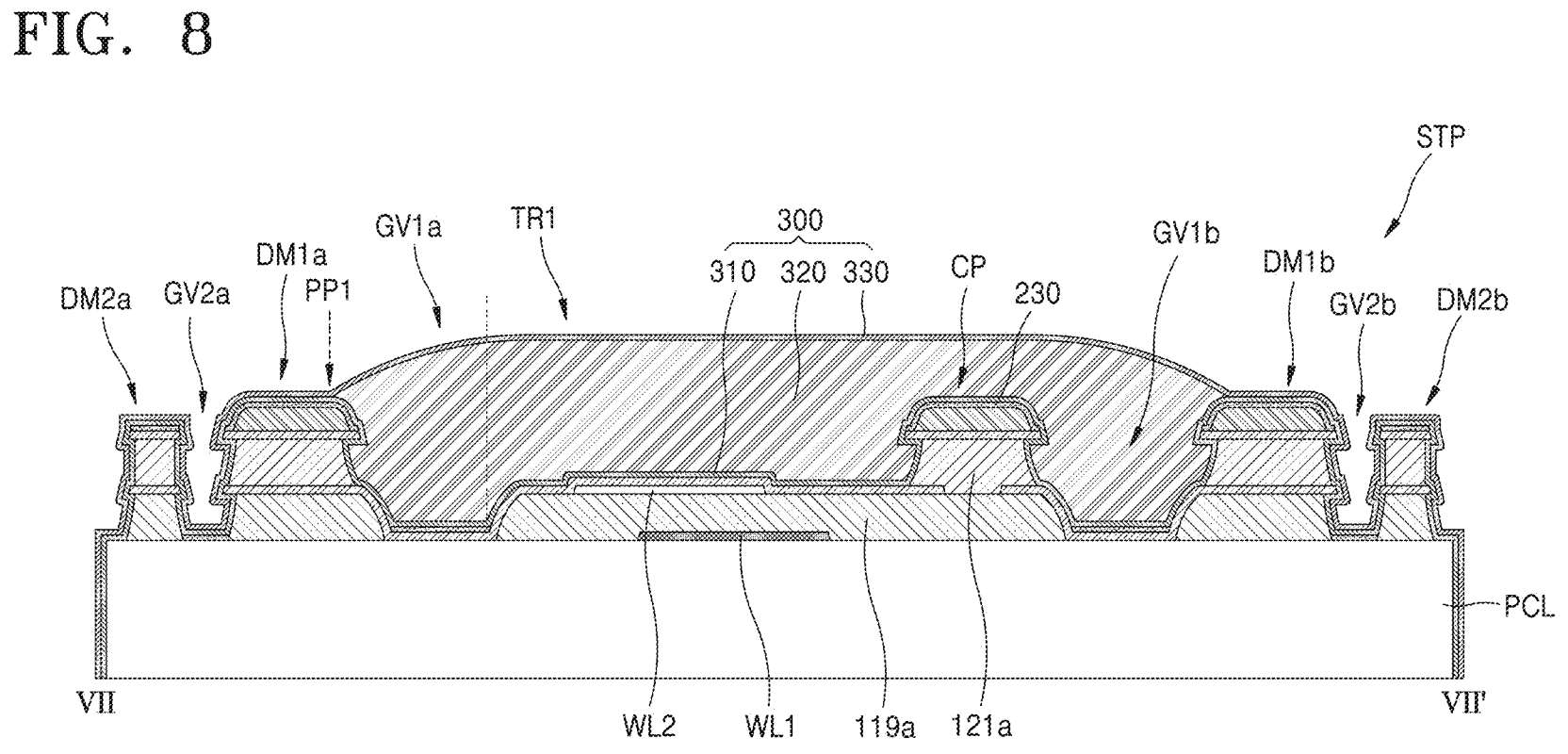
Figure 9:
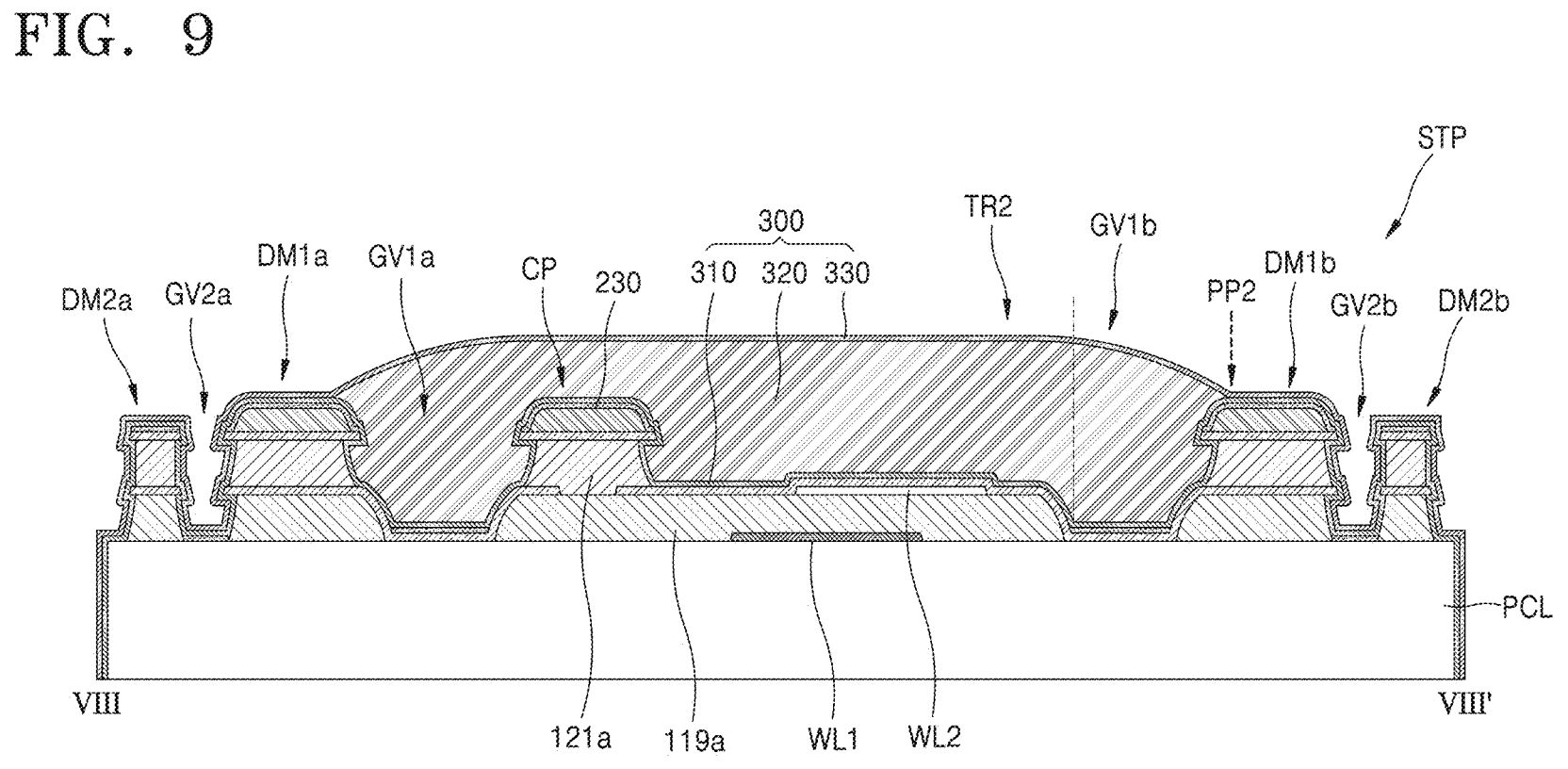

FIG. 7 is a cross-sectional view of the strip portion STP of FIG. 6 taken along line VI-VI' of FIG. 6, FIG. 8 is a cross-sectional view of the strip portion STP of FIG. 6 taken along line VII-VII' of FIG. 6, and FIG. 9 is a cross-sectional view of the strip portion STP of FIG. 6 taken along line VIII-VIII' of FIG. 6.

First, referring to FIG. 7, the strip portion STP may include a pixel circuit layer PCL. The pixel circuit layer PCL may include at least one transistor TFT, a storage capacitor Cst, and/or a first connection electrode CM1. The pixel circuit layer PCL may include at least one insulating layer. In an embodiment, the pixel circuit layer PCL may include a substrate 100, a buffer layer 111, a first gate insulating layer 113, a second gate insulating layer 115, and an interlayer insulating layer 117, for example.

The central portion CP, the first dam DM1, and the second dam DM2 may be arranged on the pixel circuit layer PCL. The first dam DM1 may include the first portion DM1*a* and the second portion DM1*b* facing each other with the central portion CP therebetween. The second dam DM2 may include the first portion DM2*a* and the second portion DM2*b* facing each other with the central portion CP therebetween.

The first groove GV1 may be between the central portion CP and the first dam DM1. In other words, the first groove GV1 may be defined by the central portion CP, the first dam DM1, and the pixel circuit layer PCL. In an embodiment, the first portion GV1*a* of the first groove GV1 may be between the central portion CP and the first portion DM1*a* of the first dam DM1, and the second portion GV1*b* of the first groove GV1 may be between the central portion CP and the second portion DM1*b* of the first dam DM1, for example. In other words, the first portion GV1*a* of the first groove GV1 may be defined by the central portion CP, the first portion DM1*a* of the first dam DM1, and the pixel circuit layer PCL, and the second portion GV1*b* of the first groove GV1 may be defined by the central portion CP, the second portion DM1*b* of the first dam DM1, and the pixel circuit layer PCL.

The second groove GV2 may be between the first dam DM1 and the second dam DM2. In other words, the second groove GV2 may be defined by the first dam DM1, the second dam DM2, and the pixel circuit layer PCL. In an embodiment, the first portion GV2*a* of the second groove GV2 may be between the first portion DM1*a* of the first dam DM1 and the first portion DM2*a* of the second dam DM2, and the second portion GV2*b* of the second groove GV2 may be located between the second portion DM1*b* of the first dam DM1 and the second portion DM2b of the second dam DM2, for example. In other words, the first portion GV2a of the second groove GV2 may be defined by the first portion DM1a of the first dam DM1, the first portion DM2a of the second dam DM2, and the pixel circuit layer PCL, and the second portion GV2b of the second groove GV2 may be defined by the second portion DM1b of the first dam DM1, the second portion DM2b of the second dam DM2, and the pixel circuit layer PCL.

In an embodiment, as shown in FIG. 8, a first trench TR1 may be located in the central portion CP. The first trench TR1 may extend from the first portion GV1a of the first groove GV1.

As shown in FIG. 11, which will be described later, the organic droplets 320p may be injected into a portion of the central portion CP. The organic droplets 320p may be directly injected into a portion of the first trench TR1 located in the central portion CP. The organic droplets 320p may move to the first portion GV1a of the first groove GV1 along the first trench TR1 by a capillary action. Accordingly, the organic droplets 320p may gradually fill the first portion GV1a of the first groove GV1 and further fill up to a first point PP1.

In an embodiment, as shown in FIG. 9, a second trench TR2 may be located in the central portion CP. The second trench TR2 may extend from the second portion GV1b of the first groove GV1.

The organic droplets 320p may be directly injected into a portion of the second trench TR2 in the same manner as in the first trench TR1. The organic droplets 320p may move to the second portion GV1b of the first groove GV1 along the second trench TR2 by a capillary action. Accordingly, the organic droplets 320p may gradually fill the second portion GV1b of the first groove GV1 and further fill up to a second point PP2.

As a comparative example, at least one trench TR may not be defined in the central portion CP. In this case, when the organic droplets 320p for forming an organic encapsulation layer 320 are injected into the central portion CP, the organic droplets 320p may flow randomly (or irregularly). In other words, because the flow of the organic droplets 320p is not controlled, the organic droplets 320p may flow beyond the first dam DM1 into the second groove GV2 or flow into the first groove GV1. Accordingly, end positions of the organic encapsulation layers 320 respectively formed or provided in the strip portions STP are different from each other, so that reliability of a display panel and/or a display device is deteriorated.

However, when at least one trench TR extended to the first groove GV1 is located (or defined) in the central portion CP as in an embodiment, the organic droplets 320p injected into a portion of the central portion CP do not flow randomly, but may gradually fill the first groove GV1 along the at least one trench TR. Accordingly, the organic droplets 320p do not flow irregularly, but constantly move to a path formed or provided by the at least one trench TR, so the end positions of the organic encapsulation layers 320 respectively formed or provided in the strip portions STP may be the same. At least a portion of the organic encapsulation layer 320 of each of the strip portions STP may be buried in the first groove GV1 and the trench TR, and may be formed or provided between the first point PP1 and the second point PP2. The organic encapsulation layer 320 of each of the strip portions STP may be formed or provided between the first portion DM1a of the first dam DM1 and the second portion DM1b of the first dam DM1.

Hereinafter, a configuration included in the strip portion STP will be described in more detail according to a stacked structure with reference to FIG. 7. FIG. 7 illustrates the strip portion STP, and some members may be omitted.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layer structure including a layer including the above-described polymer resin and an inorganic layer (not shown).

The buffer layer 111 may reduce or block the penetration of foreign materials, moisture, or external air from a lower portion of the substrate 100 and may provide a flat surface on the substrate 100. In an embodiment, the buffer layer 111 may include an inorganic material, such as an oxide or nitride, an organic material, or an organic-inorganic composite material, and may have a single layer structure or a multilayer structure including an inorganic material or an organic material.

A barrier layer (not shown) may be further included between the substrate 100 and a buffer layer 111. The barrier layer may prevent or minimize penetration of impurities from the substrate 100 into a semiconductor layer Act. In an embodiment, the barrier layer may include an inorganic material, such as an oxide or nitride, an organic material, or an organic-inorganic composite material, and may have a single layer structure or a multilayer structure including an inorganic material and/or an organic material.

The semiconductor layer Act may be on the buffer layer 111. The semiconductor layer Act may include amorphous silicon or polysilicon. In another embodiment, the semiconductor layer Act may include an oxide of at least one of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layer Act may include a channel area and a source area and a drain area arranged on opposite sides of the channel area. The semiconductor layer Act may be a single layer or multiple layers.

The first gate insulating layer 113 and the second gate insulating layer 115 may be stacked and arranged on the substrate 100 to cover the semiconductor layer Act. The first gate insulating layer 113 and the second gate insulating layer 115 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). ZnO may be ZnO and/or $ZnO_2$.

A gate electrode GE may be on the first gate insulating layer 113. The gate electrode GE may at least partially overlap the semiconductor layer Act. The gate electrode GE includes molybdenum (Mo), aluminum (Al), copper (Cu), titanium (Ti), or the like, and may include a single layer or multiple layers. In an embodiment, the gate electrode GE may be a single layer of Mo, for example.

A second electrode CE2 of the storage capacitor Cst may be on the second gate insulating layer 115. The second electrode CE2 of the storage capacitor Cst includes Mo, Al, Cu, Ti, or the like, and may include a single layer or multiple layers. In an embodiment, the second electrode CE2 of the storage capacitor Cst may be a single layer of Mo, for example.

In an embodiment, the storage capacitor Cst includes a first electrode CE1 and the second electrode CE2, and may overlap the transistor TFT as shown in FIG. 7. In an embodiment, the gate electrode GE of the transistor TFT may function as the first electrode CE1 of the storage capacitor Cst, for example. In an alternative embodiment, the storage capacitor Cst may exist separately from the transistor TFT.

The second electrode CE2 of the storage capacitor Cst overlaps the first electrode CE1 with the second gate insulating layer 115 therebetween to form a capacitance. In this case, the second gate insulating layer 115 may function as a dielectric layer of the storage capacitor Cst.

The interlayer insulating layer 117 may be provided on the second gate insulating layer 115 to cover the second electrode CE2 of the storage capacitor Cst. The interlayer insulating 117 may include $SiO_2$, $SiN_x$, SiON, $Al_2O_3$, $Ta_2O_5$, $HfO_2$, or $ZnO_x$. $ZnO_x$ may be ZnO and/or $ZnO_2$.

Although FIG. 7 illustrates that the transistor TFT for driving a display element 200 of the corner display area CDA (refer to FIG. 1) is disposed in the strip portion STP, in another embodiment, the transistor TFT driving the display element 200 of the corner display area CDA may be disposed in the main display area MDA or the auxiliary display area ADA. In this case, the display element 200 and the transistor TFT may not overlap each other.

The first connection electrode CM1 may be on the interlayer insulating 117. The first connection electrode CM1 may be connected to the semiconductor layer Act through a contact hole defined in the first gate insulating layer 113, the second gate insulating layer 115, and the interlayer insulating 117. The first connection electrode CM1 may include a conductive material including Mo, Al, Cu, Ti, or the like, and may include a single layer or multiple layers including the above materials. In an embodiment, the first connection electrode CM1 may have a multilayer structure of Ti/Al/Ti, for example.

Referring to FIGS. 8 and 9, a first wire WL1 may be on the interlayer insulating 117. In an embodiment, the first wire WL1 may transmit an electrical signal, such as a data signal (or data voltage), a scan signal, or a driving voltage, to the pixels PX. The first wire WL1 may include the same material as that of the first connection electrode CM1.

FIGS. 8 and 9 illustrate one first wire WL1, but in another embodiment, a plurality of first wires WL1 may be provided. In another embodiment, the first wire WL1 may be omitted.

Referring back to FIG. 7, a first planarization layer 119 and a second planarization layer 121 may be arranged to cover the first connection electrode CM1. The first planarization layer 119 and the second planarization layer 121 may include a single layer or multiple layers of an organic material, and provide a flat top surface. In an embodiment, the first planarization layer 119 and the second planarization layer 121 may include a general purpose polymer such as benzocyclobutene ("BCB"), polyimide, hexamethyldisiloxane ("HMDSO"), polymethylmethacrylate ("PMMA"), and polystyrene ("PS"), a polymer derivative including a phenolic group, an acrylic polymer, an imide polymer, an aryl ether polymer, an amide polymer, a fluorine-based polymer, a p-xylene-based polymer, a vinyl alcohol polymer, or any combinations thereof.

The first planarization layer 119 may include a first insulating pattern 119*a*, a second insulating pattern 119*b*, and a third insulating pattern 119*c* spaced apart from each other. The first insulating pattern 119*a* may constitute the central portion CP, the second insulating pattern 119*b* may constitute the first dam DM1, and the third insulating pattern

119*c* may constitute the second dam DM2. In other words, the central portion CP may include the first insulating pattern 119*a*, the first dam DM1 may include the second insulating pattern 119*b*, and the second dam DM2 may include the third insulating pattern 119*c*.

The second planarization layer 121 may include a fourth insulating pattern 121*a*, a fifth insulating pattern 121*b*, and a sixth insulating pattern 121*c* spaced apart from each other. The fourth insulating pattern 121*a* may constitute the central portion CP, the fifth insulating pattern 121*b* may constitute the first dam DM1, and the sixth insulating pattern 121*c* may constitute the second dam DM2. In other words, the central portion CP may include the fourth insulating pattern 121*a*, the first dam DM1 may include the fifth insulating pattern 121*b*, and the second dam DM2 may include the sixth insulating pattern 121*c*.

Referring to FIG. 8, the first insulating pattern 119*a* may be between the first portion GV1*a* and the second portion GV1*b* of the first groove GV1, and the fourth insulating pattern 121*a* may be between the first trench TR1 and the second portion GV1*b* of the first groove GV1. In addition, referring to FIG. 9, the first insulating pattern 119*a* may be between the first portion GV1*a* and the second portion GV1*b* of the first groove GV1, and the fourth insulating pattern 121*a* may be between the second trench TR2 and the first portion GV1*a* of the first groove GV1. An entirety of the first insulating pattern 119*a* may be disposed in the central area of the strip portion STP in a plan view, and the fourth insulating pattern 121*a* may be partially disposed between the trenches TR and the first groove GV1. The fourth insulating pattern 121*a* may extend substantially in the first direction DR1. The fourth insulating pattern 121*a* may have a zigzag shape.

Referring back to FIG. 7, a first inorganic protective layer PVX1 may be between the first planarization layer 119 and the second planarization layer 121. The first inorganic protective layer PVX1 may protect a conductive layer exposed by the first groove GV1 and/or the second groove GV2. In an embodiment, the first inorganic protective layer PVX1 may be a single layer or multiple layers including an inorganic material such as silicon nitride ($SiN_x$) and/or silicon oxide ($SiO_x$).

The first inorganic protective layer PVX1 may include a plurality of first inorganic patterns spaced apart from each other. Each of the first inorganic patterns may constitute at least one of the central portion CP, the first dam DM1, and the second dam DM2. In an embodiment, some of the first inorganic patterns may extend in one direction and may be between the first insulating pattern 119*a* and the fourth insulating pattern 121*a* and between the second insulating pattern 119*b* and the fifth insulating pattern 121*b*, and may cover at least a portion of the first groove GV1, for example. Another portion of the first inorganic patterns may be between the third insulating pattern 119*c* and the sixth insulating pattern 121*c*. This is only an example, and a structure in which the first inorganic patterns are arranged may vary.

A second connection electrode CM2 may be on the first planarization layer 119. The second connection electrode CM2 may be connected to the first connection electrode CM1 through a contact hole defined in the first planarization layer 119, and may be connected to the transistor TFT connected to the first connection electrode CM1. The second connection electrode CM2 may include a conductive material including Mo, Al, Cu, Ti, or the like, and may include a single layer or multiple layers including the above materials. In an embodiment, the second connection electrode CM2 may have a multilayer structure of Ti/Al/Ti, for example.

Referring to FIGS. 8 and 9, a second wire WL2 may be on the first planarization layer 119 (e.g., a first insulating pattern 119a). In an embodiment, the second wire WL2 may transmit an electrical signal, such as a data signal (or data voltage), a scan signal, or a driving voltage, to the pixels PX. The second wire WL2 may include the same material as that of the second connection electrode CM2.

FIGS. 8 and 9 illustrate one second wire WL2, but in another embodiment, a plurality of second wires WL2 may be provided. In another embodiment, the second wire WL2 may be omitted.

Referring back to FIG. 7, a second inorganic protective layer PVX2 may be on the second planarization layer 121. In an embodiment, the second inorganic protective layer PVX2 may be a single layer or multiple layers including an inorganic material such as $SiN_x$ and/or $SiO_x$.

The second inorganic protective layer PVX2 may include a plurality of second inorganic patterns spaced apart from each other. Each of the second inorganic patterns may be on any one of the fourth insulating pattern 121a, the fifth insulating pattern 121b, and the sixth insulating pattern 121c. In other words, each of the second inorganic patterns may constitute any one of the central portion CP, the first dam DM1, and the second dam DM2.

The display element 200 may be on the second inorganic protective layer PVX2. The display element 200 may be an OLED. The display element 200 may include a pixel electrode 210, an intermediate layer 220 including an organic light-emitting layer, and an opposite electrode 230. The display element 200 may be connected to the transistor TFT through a contact hole defined in the second planarization layer 121 and the second connection electrode CM2. As a result, the display element 200 may be driven by the transistor TFT.

The pixel electrode 210 may be a (semi-) transparent electrode or a reflective electrode. In some embodiments, the pixel electrode 210 may include a reflective layer including Ag, Mg, Al, Pt, Pd, Au, Ni, Nd, Ir, Cr, or any combinations thereof, and a transparent or semi-transparent electrode layer formed or disposed on the reflective layer. The transparent or semi-transparent electrode layer may include at least one of indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In some embodiments, the pixel electrode 210 may include ITO/Ag/ITO.

In a display area of the substrate 100, a pixel defining layer 123 may be on the second planarization layer 121. The pixel defining layer 123 may cover an edge of the pixel electrode 210 and an opening exposing a central portion of the pixel electrode 210 may be defined in the pixel defining layer. A light-emitting area of the display element 200 may be defined by the opening. The pixel defining layer 123 may prevent an arc from occurring at the edge of the pixel electrode 210 by increasing a distance between the edge of the pixel electrode 210 and the opposite electrode 230 on the pixel electrode 210.

The pixel defining layer 123 may include at least one organic insulating material of polyimide, polyamide, acrylic resin, benzocyclobutene, and phenolic resin. The pixel defining layer 123 may include an organic insulating material. In an alternative embodiment, the pixel defining layer 123 may include an inorganic insulating material such as silicon nitride, silicon oxynitride, or silicon oxide. In an alternative embodiment, the pixel defining layer 123 may include an organic insulating material and an inorganic insulating material. In some embodiments, the pixel defining layer 123 includes a light-blocking material and may be provided in black. In an embodiment, the light-blocking material may include resins or pastes including carbon black, carbon nanotubes, or black dye, metal particles such as nickel, aluminum, molybdenum, and alloys thereof, metal oxide particles (e.g., chromium oxide), or metal nitride particles (e.g., chromium nitride). When the pixel defining layer 123 includes a light-blocking material, reflection of external light by metal structures arranged under the pixel defining layer 123 may be reduced.

The pixel defining layer 123 may include a seventh insulating pattern 123a and an eighth insulating pattern 123b that are spaced apart from each other. The eighth insulating pattern 123b may constitute the first dam DM1. In other words, the first dam DM1 may include the eighth insulating pattern 123b. This is only an embodiment, and a structure in which the pixel defining layer 123 is disposed may vary.

The intermediate layer 220 is disposed in the opening defined by the pixel defining layer 123 and may include an organic light-emitting layer. The organic light-emitting layer may include an organic material including a fluorescent or phosphorescent material emitting red, green, or blue light. The organic light-emitting layer may include a low-molecular weight organic material or a high-molecular weight organic material. In an embodiment, a functional layer such as a hole transport layer ("HTL"), a hole injection layer ("HIL"), an electron transport layer ("ETL"), or an electron injection layer ("EIL") may selectively be further disposed over and below the organic light-emitting layer.

The opposite electrode 230 may be a transparent electrode or a reflective electrode. In some embodiments, the opposite electrode 230 may be a transparent electrode or semi-transparent electrode, and may include a metal thin-film, which has a small work function, including Li, Ca, lithium fluoride (LiF), Al, Ag, Mg, or any combinations thereof, or a material with multilayer structure such as LiF/Ca or LiF/Al. Furthermore, a transparent conductive oxide ("TCO") layer including ITO, IZO, ZnO, $In_2O_3$ or the like may further be disposed on the metal thin-film. The opposite electrode 230 is disposed over the display area and may be disposed on the intermediate layer 220 and the pixel defining layer 123. The opposite electrode 230 may be unitary over a plurality of display elements 200 to correspond to a plurality of pixel electrodes 210.

Portions 230p of the opposite electrode 230 may be cut off by the first groove GV1 and/or the second groove GV2, respectively. The portions 230p of the opposite electrode 230 may be respectively arranged in the first groove GV1 and/or the second groove GV2.

Because the display element 200 including the organic light-emitting layer may be easily damaged by moisture or oxygen from the outside, an encapsulation layer 300 may cover the display element 200 to protect the same. The encapsulation layer 300 may be on the opposite electrode 230, may cover the display area, and may extend to at least a portion of a peripheral area. The encapsulation layer 300 may include a first inorganic encapsulation layer 310, the organic encapsulation layer 320, and a second inorganic encapsulation layer 330. In an embodiment, the first inorganic encapsulation layer 310 and the second inorganic encapsulation layer 330 may include one or more inorganic insulating materials such as aluminum oxide, titanium oxide, tantalum oxide, hafnium oxide, zinc oxide, silicon oxide, silicon nitride, or silicon oxynitride. The organic encapsulation layer 320 may include a polymer-based material. Examples of the polymer-based material may include an acrylic resin, an epoxy resin, polyimide, and/or polyethylene. In an embodiment, the organic encapsulation layer 320 may include acrylate.

Figure 10:
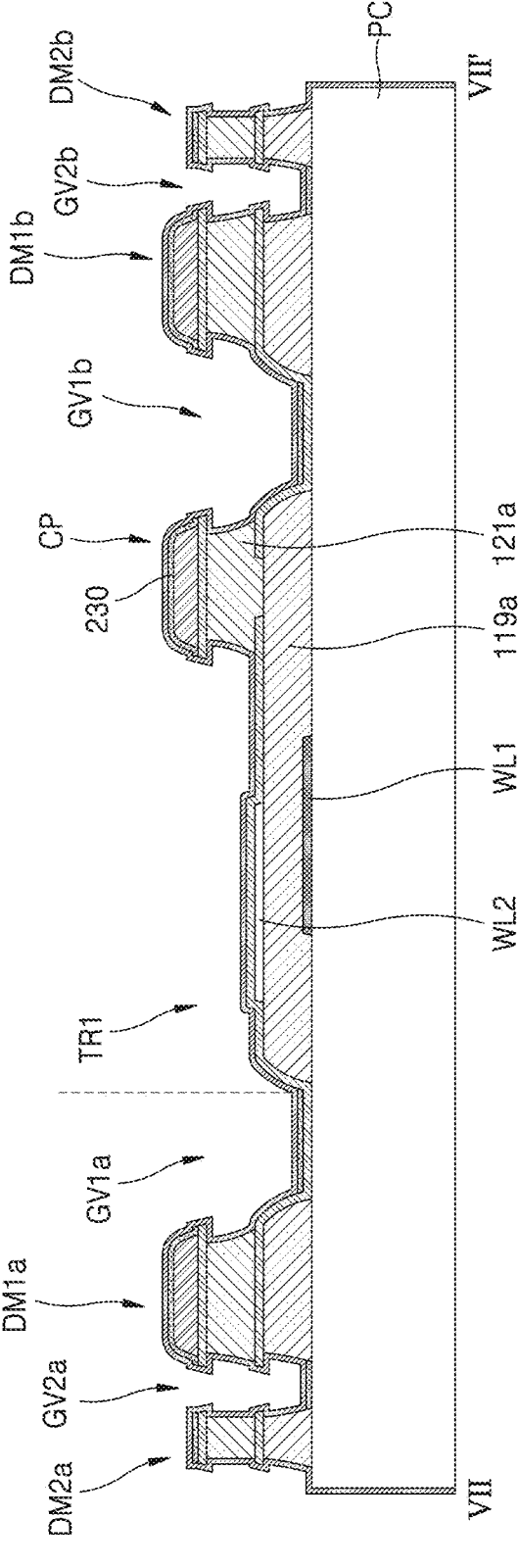
Figure 12:
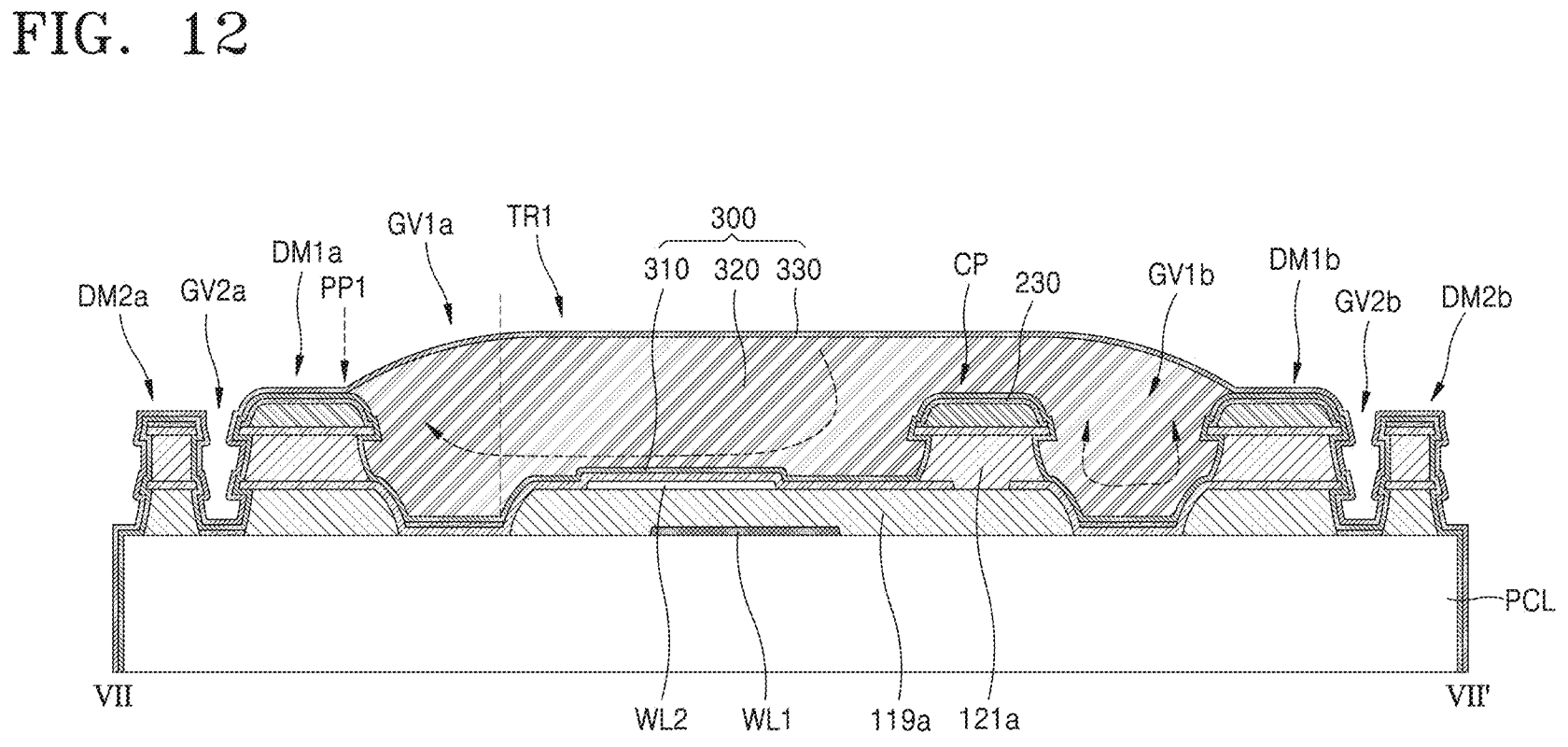

FIGS. 10 to 12 are views sequentially illustrating an embodiment of a method of manufacturing the display panel 10. Although FIGS. 10 and 12 are described with reference to FIG. 8, the same may be applied to FIGS. 7 and 9.

First, referring to FIG. 10, the pixel circuit layer PCL, the first planarization layer 119, the first inorganic protective layer PVX1, the second planarization layer 121, the second inorganic protective layer PVX2; the pixel defining layer 123, the opposite electrode 230, the first inorganic encapsulation layer 310, or the like may be formed or provided in the order described above in FIG. 7. In an embodiment, a semiconductor layer on a substrate may be formed or provided through an etching process of applying a semiconductor material layer to an entirety of the surface of the substrate and then etching a portion of the semiconductor material layer, for example. Each of conductive layers arranged on the substrate may be formed or provided through an etching process of applying a conductive material layer to an entirety of the surface of the substrate and then etching a portion of the conductive material layer. Each of the first planarization layer 119, the first inorganic protective layer PVX1, the second planarization layer 121, the second inorganic protective layer PVX2, and the pixel defining layer 123 may be formed or provided by applying an insulating material layer to an entirety of the surface of the substrate and then forming a pattern through a photolithography process or through an additional etching process after the photolithography process. The first groove GV1, the second groove GV2, and the trench TR may be defined by etching a portion of the insulating material layer.

Referring to FIG. 11, after the first inorganic encapsulation layer 310 is formed or disposed on the opposite electrode 230, the organic droplets 320p may be injected into the first inorganic encapsulation layer 310. An area in which the organic droplets 320p are injected may correspond to a portion of the central portion CP.

In an embodiment, a sum of a width jw through which the organic droplets 320p are injected, a first distance eg1 between the first portion DM1a of the first dam DM1 and an end of the first trench TR1, and a second distance eg2 between an end of the second trench TR2 and the second portion DM1b of the first dam DM1 may be greater than a third distance pw between the first portion DM1a of the first dam DM1 and the second portion DM1b of the first dam DM1. In this case, the organic droplets 320p may be directly injected into a portion of each of the first trenches TR1 and a portion of each of the second trenches TR2. When the organic droplets 320p are directly injected into a portion of each of the first trenches TR1 and a portion of each of the second trenches TR2, the organic droplets 320p may move to the first groove GV1 along the first trenches TR1 and the second trenches TR2 by a capillary action (refer to arrows). Therefore, as shown in FIGS. 11 and 12, the organic droplets 320p may gradually fill the first groove GV1 and may fill up to the first point PP1 and the second point PP2. In an embodiment, the width jw through which the organic droplets 320p are injected may be about 30 micrometers (μm) to about 170 μm.

As such, because the organic droplets 320p do not move irregularly through the first trenches TR1 and the second trenches TR2, the location of the finally formed organic encapsulation layer 320 may be the same for each of the strip portions STP. In an embodiment, at least a portion of the organic encapsulation layer 320 of each of the strip portions STP may be buried in the first groove GV1, the first trenches TR1, and the second trenches TR2 and may be defined between the first point PP1 and the second point PP2, for example. The organic encapsulation layer 320 of each of the strip portions STP may be formed or provided between the first portion DM1a of the first dam DM1 and the second portion DM1b of the first dam DM1. Because respective end positions of the organic encapsulation layers 320 formed or disposed in the strip portions STP may be the same, reliability of a display panel and/or a display device may be improved.

Referring to FIG. 12, after the organic encapsulation layer 320 is formed or provided, the second inorganic encapsulation layer 330 may be formed or disposed on the organic encapsulation layer 320. In an embodiment, the second inorganic encapsulation layer 330 may include one or more inorganic insulating materials such as aluminum oxide, titanium oxide, tantalum oxide, hafnium oxide, zinc oxide, silicon oxide, silicon nitride, or silicon oxynitride.

Figure 13:
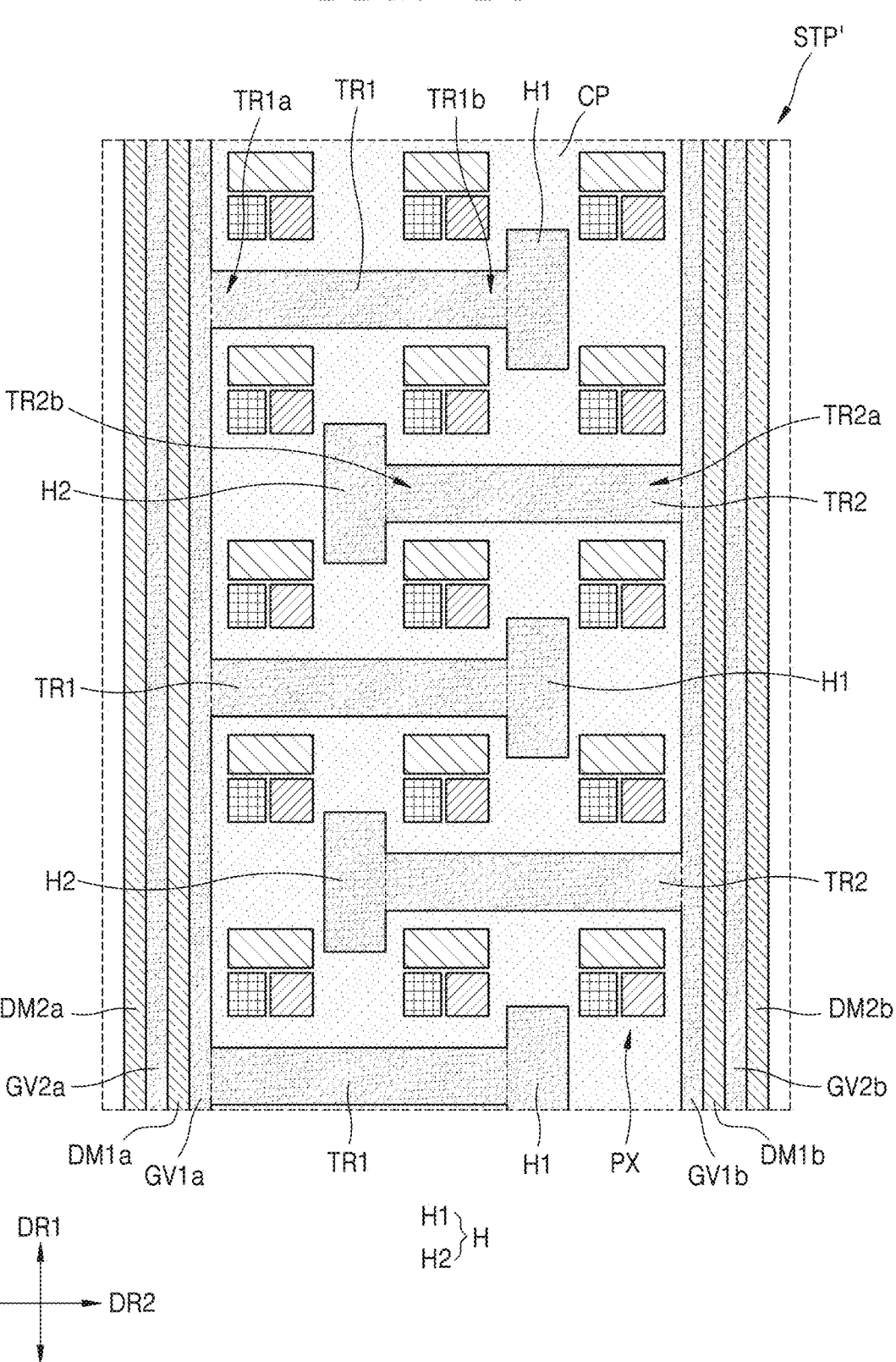
FIG. 13 is an enlarged plan view of another embodiment of a strip portion of a display panel.

FIG. 13 is an enlarged plan view of another embodiment of a strip portion of a display panel. FIG. 13 is a modified embodiment of FIG. 6, which differs in a structure of a trench. Hereinafter, the repeated content will be replaced with the description of FIG. 6, and differences will be mainly described.

Referring to FIG. 13, one or more holes H may be defined in a strip portion STP'. The holes H are located between columns of the pixels PX in the central portion CP and may extend in the first direction DR1. In an embodiment, one column of pixels PX may be between the holes H. In FIG. 13, one column of pixels PX are between the holes H, but in another embodiment, one or more columns of pixels PX may be between the holes H, for example. In an embodiment, two columns of pixels PX may be between the holes H, for example.

The holes H may be extended to respective ends of the trenches TR. In an embodiment, a first hole H1 of the plurality of holes H may be extended to an end of each of the first trenches TR1, and a second hole H2 of the plurality of holes H may be extended to an end of each of the second trenches TR2, for example.

In other words, each of the first trenches TR1 may include a first end TR1a extended to the first portion GV1a of the first groove GV1 and a second end TR1b extended to the first hole H1, and each of the second trenches TR2 may include a third end TR2a extended to the second portion GV1b of the first groove GV1 and a fourth end TR2b extended to the second hole H2.

In FIG. 13, the hole H is illustrated as being located in two adjacent rows of pixels PX, but this is only an example and various modifications are possible. Hereinafter, it will be described with reference to FIG. 14 in relation to a modified embodiment.

Figure 14:
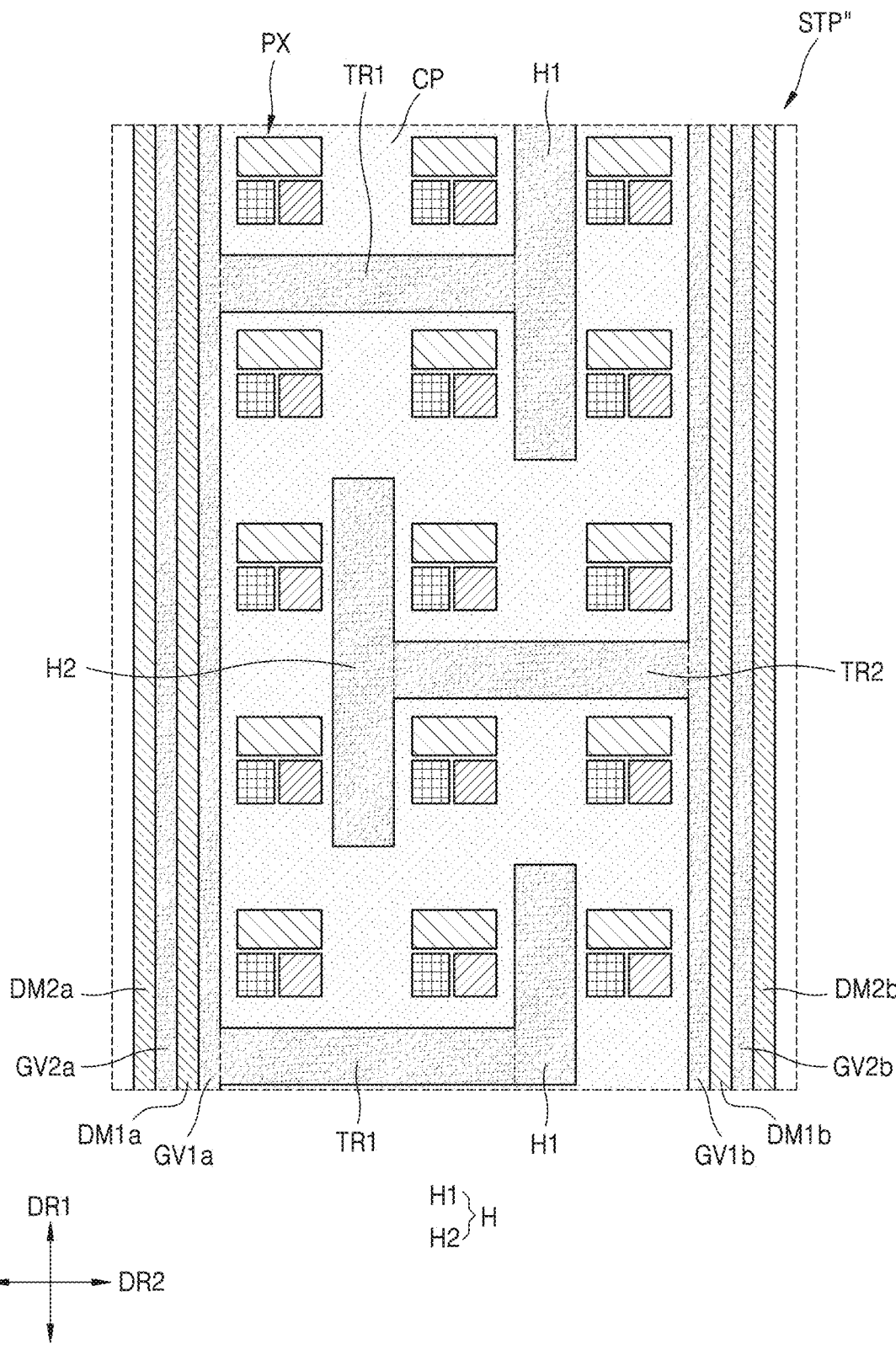
FIG. 14 is an enlarged plan view of another embodiment of a strip portion of a display panel.

FIG. 14 is an enlarged plan view of another embodiment of a strip portion of the display panel 10. FIG. 14 is a modified embodiment of FIG. 13, which differs in a structure of a trench. Hereinafter, the repeated content will be replaced with the description of FIG. 13, and differences will be mainly described.

Referring to FIG. 14, unlike in FIG. 13, two rows of pixels PX may be between the trenches TR. Two rows of pixels PX may be disposed between the first trench TR1 and the second trench TR2 adjacent to each other. In addition, the holes H in a strip portion STP" may correspond to the pixels PX in four rows. In other words, the holes H may extend further in the first direction DR1 than the holes H illustrated in FIG. 13.

Figure 15:
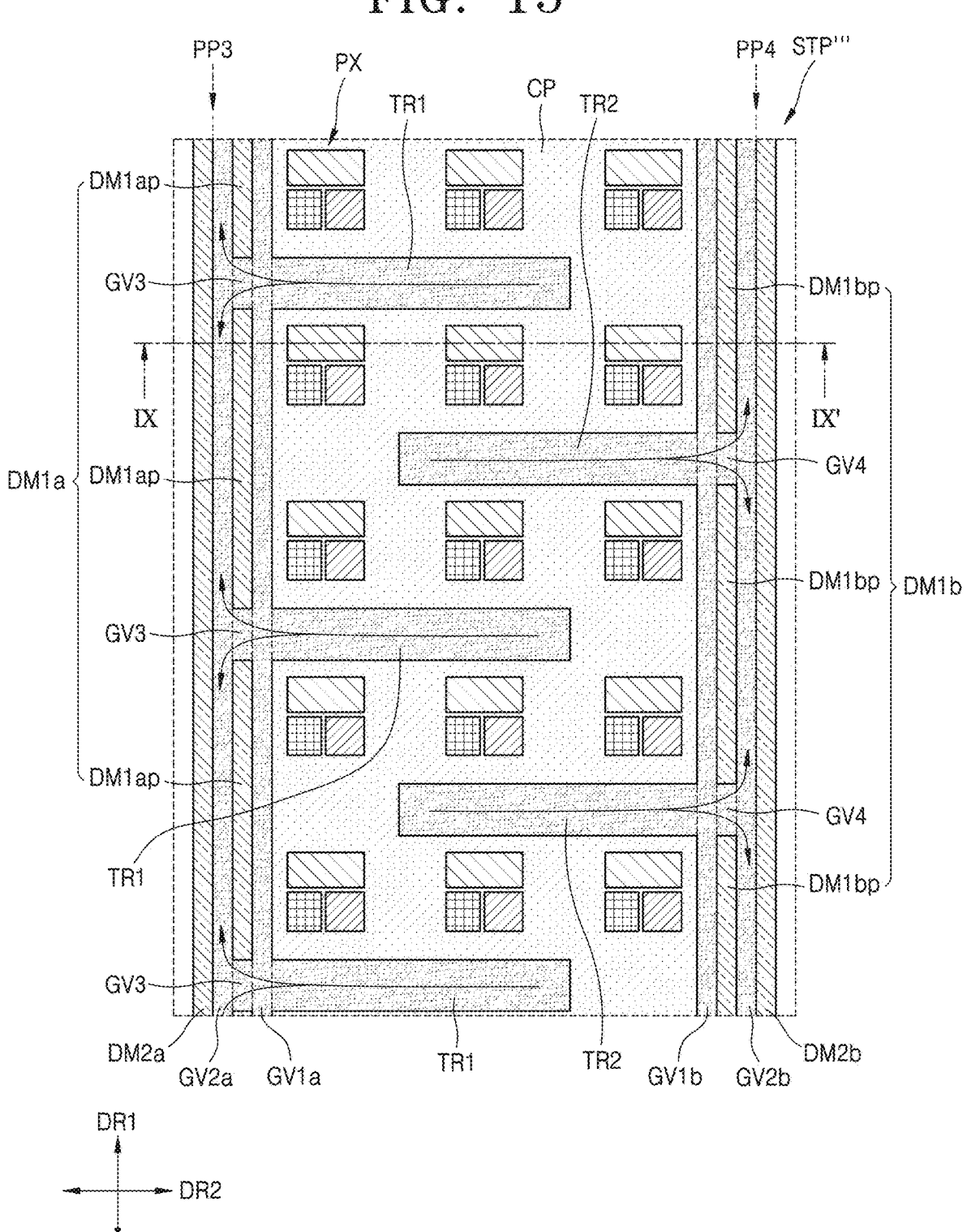
FIG. 15 is an enlarged plan view of another embodiment of a strip portion of a display panel.
Figure 16:
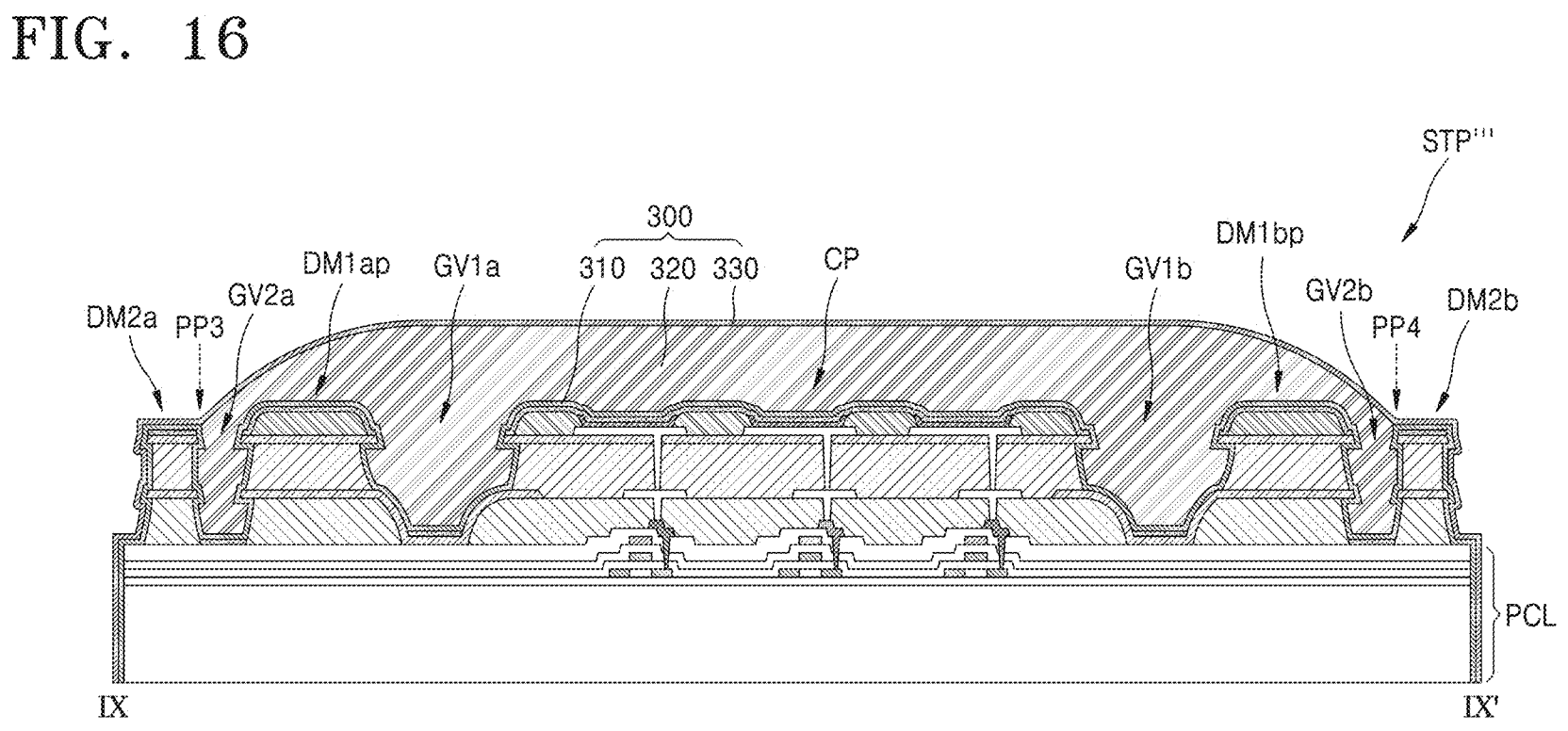

FIG. 15 is an enlarged plan view of another embodiment of a strip portion of a display panel, and FIG. 16 is a cross-sectional view of the strip portion of FIG. 15 taken along line IX-IX' of FIG. 15. FIGS. 15 and 16 are modified embodiments of FIGS. 6 and 7, respectively, and there is a difference in the structure of a first groove and a second groove. Hereinafter, the repeated contents will be replaced with the descriptions of FIGS. 6 and 7, and differences will be mainly described.

First, referring to FIG. 15, one or more third grooves GV3 and one or more fourth grooves GV4 may be defined in a strip portion STP'''.

The third grooves GV3 may be extended to the first portion GV1a of the first groove GV1 and the first portion GV2a of the second groove GV2. The first portion DM1a of the first dam DM1 may include a plurality of first sub-dams DM1ap spaced apart from each other, and the third grooves GV3 may be located between the first sub-dams DM1ap, respectively. Each of the third grooves GV3 may be on the same line as a corresponding first trench TR1 from among the first trenches TR1.

The fourth grooves GV4 may be extended to the second portion GV1b of the first groove GV1 and the second portion GV2b of the second groove GV2. The second portion DM1b of the first dam DM1 may include a plurality of second sub-dams DM1bp spaced apart from each other, and the fourth grooves GV4 may be defined between the second sub-dams DM1bp, respectively. Each of the fourth grooves GV4 may be on the same line as a corresponding second trench TR2 from among the second trenches TR2.

As shown in FIG. 11, the organic droplets 320p may be injected into a portion of the central portion CP. The organic droplets 320p may be directly injected into a portion of each of the first trenches TR1 and a portion of each of the second trenches TR2 located in the central portion CP. The organic droplets 320p may move to the first to fourth grooves GV1, GV2, GV3, and GV4 along the first trenches TR1 and the second trenches TR2 by a capillary action. The organic droplets 320p may gradually fill the first to fourth grooves GV1, GV2, GV3, and GV4, and may fill up to a third point PP3 and a fourth point PP4. In this case, because the organic droplets 320p do not move irregularly but move constantly through a path defined by the first trenches TR1 and the second trenches TR2, the location of the finally formed organic encapsulation layer 320 may be the same for each of the strip portions STP'''. In an embodiment, as shown in FIG. 16, at least a portion of the organic encapsulation layer 320 of each of the strip portions STP''' may be buried in the first to fourth grooves GV1, GV2, GV3, and GV4, the first trenches TR1, and the second trenches TR2, and may be formed or provided between the third point PP3 and the fourth point PP4, for example. The organic encapsulation layer 320 of each of the strip portions STP''' may be formed or provided between the first portion DM2a of the second dam DM2 and the second portion DM2b of the second dam DM2. Because respective end positions of the organic encapsulation layers 320 formed or disposed in the strip portions STP''' may be the same, reliability of the display panel and/or the display device may be improved.

Figure 17:
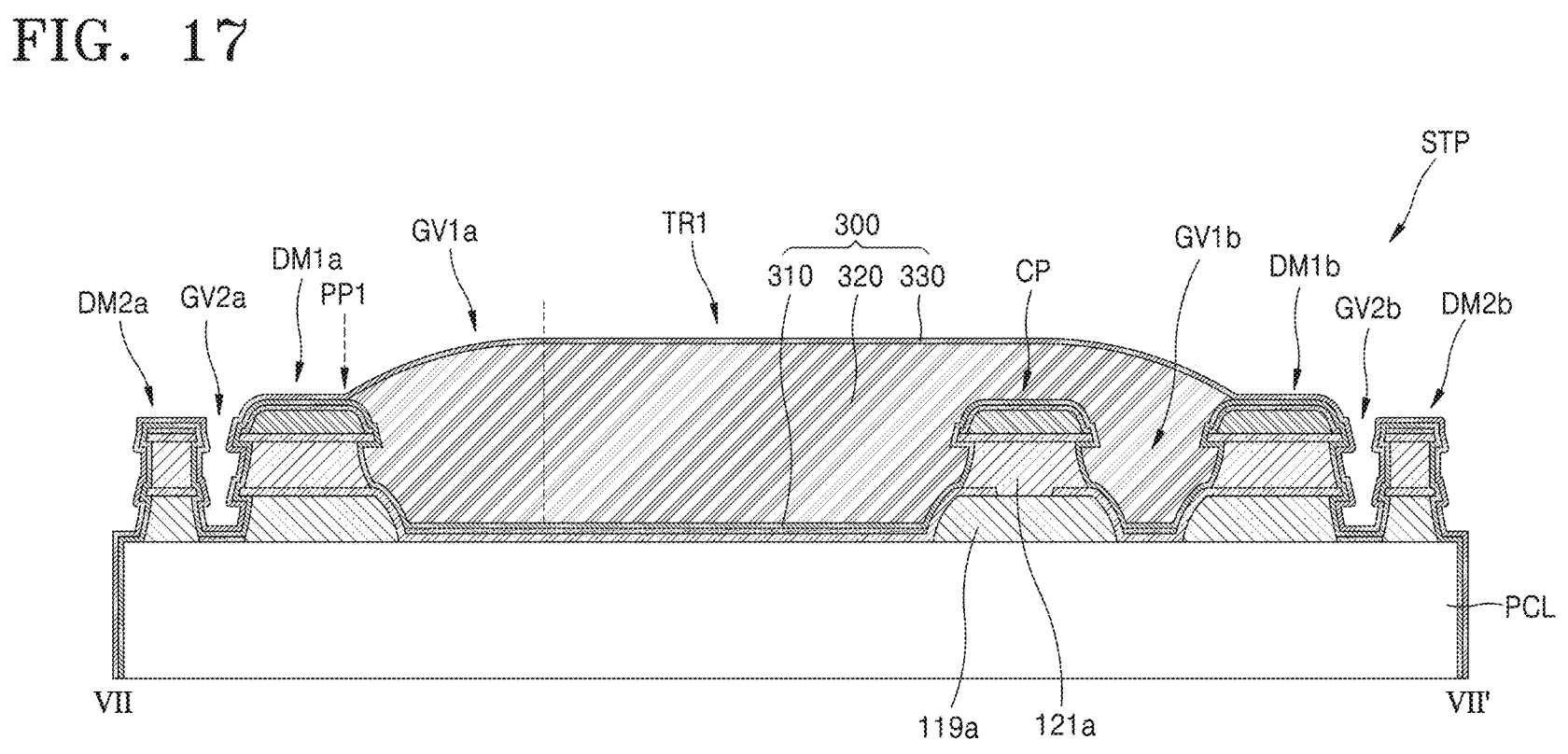
Figure 18:
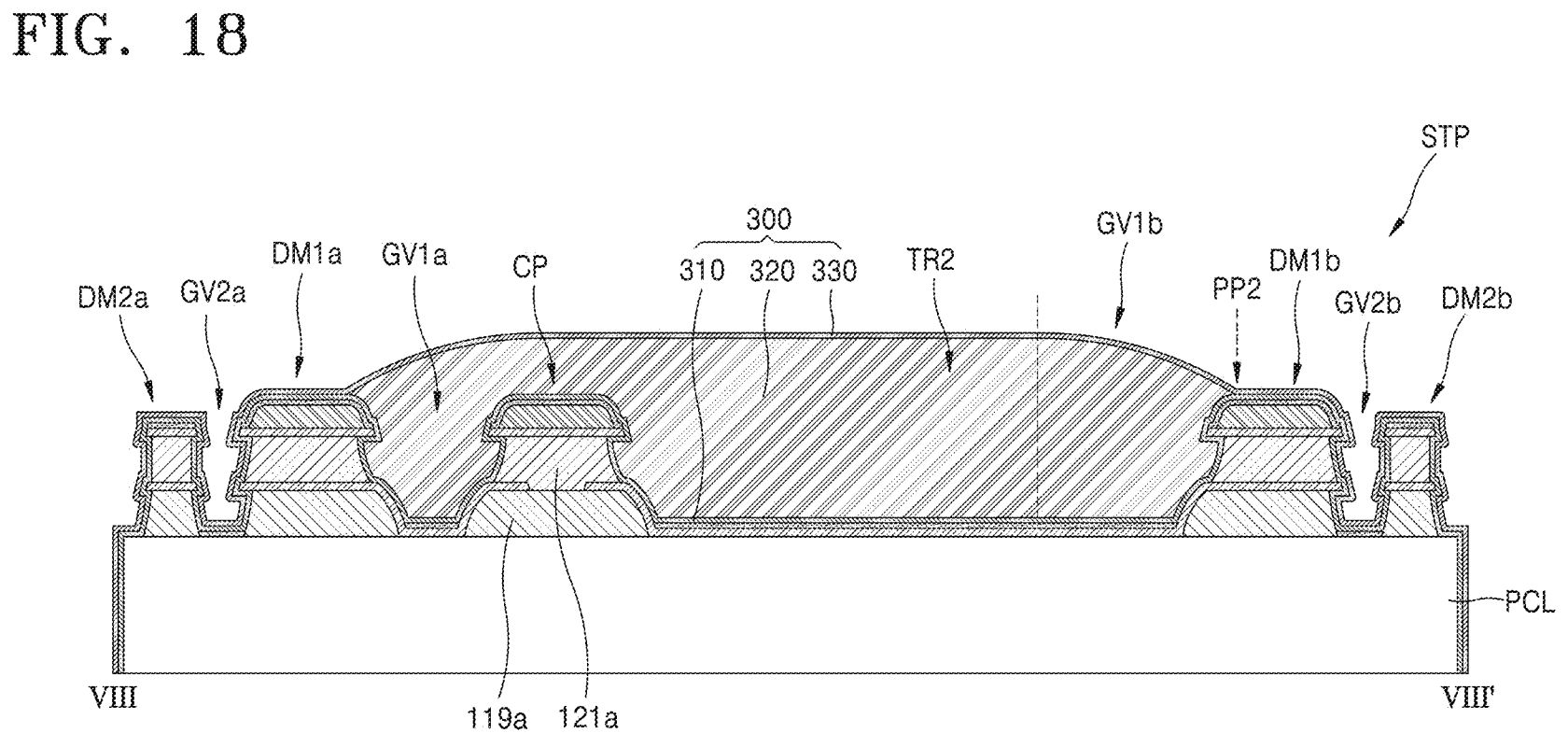

FIG. 17 is a cross-sectional view of the strip portion of FIG. 6 taken along line VII-VII' of FIG. 6, and FIG. 18 is a cross-sectional view of the strip portion of FIG. 6 taken along line VIII-VIII' of FIG. 6. FIGS. 17 and 18 are modified embodiments of FIGS. 8 and 9, respectively, and there is a difference in the structure of an insulating pattern. Hereinafter, the repeated contents will be replaced with the descriptions of FIGS. 8 and 9, and differences will be mainly described.

Referring to FIG. 17, the first insulating pattern 119a and the fourth insulating pattern 121a may be between the first trench TR1 and the second portion GV1b of the first groove GV1. In addition, referring to FIG. 18, the first insulating pattern 119a and the fourth insulating pattern 121a may be between the second trench TR2 and the first portion GV1a of the first groove GV1. In a plan view, the first insulating pattern 119a and the fourth insulating pattern 121a may be partially arranged between the trenches TR and the first groove GV1. The first insulating pattern 119a and the fourth insulating pattern 121a may extend substantially in the first direction DR1. The first insulating pattern 119a and the fourth insulating pattern 121a may have a zigzag shape.

According to various embodiments, by defining at least one trench in each of strip portions of a corner display area to define a movement path of organic droplets forming an organic encapsulation layer, locations of organic encapsulation layers respectively formed or provided in the strip portions may be constant. Accordingly, defects in reliability of a display panel and a display device may be prevented. However, the scope of the invention is not limited thereto.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display panel comprising:
   a substrate in which a main display area and a corner display area which is adjacent to a corner of the main display area are defined, the substrate including a strip portion disposed in the corner display area and extending from the corner of the main display area in a first direction;
   a central portion disposed in the strip portion; and
   display elements arranged in a matrix in the first direction and a second direction crossing the first direction, in the central portion,
   wherein a trench is located between rows of the display elements in the central portion and extends in the second direction.

2. The display panel of claim 1, further comprising a first dam disposed in the strip portion and surrounding at least a portion of the central portion.

3. The display panel of claim 2, wherein a first groove is located between the central portion and the first dam and surrounds at least a portion of the central portion along the first dam, and
   the trench extends from the first groove in the second direction.

4. The display panel of claim 3, wherein the trench comprises a first trench and a second trench alternately defined with each other,
   the first groove comprises a first portion and a second portion facing each other in the second direction,
   the first trench extends from the first portion of the first groove, and the second trench extends from the second portion of the first groove.

5. The display panel of claim 4, wherein a first hole and a second hole are located between columns of the display elements in the central portion and extend in the first direction, the first trench includes a first end extended to the first portion of the first groove, and a second end extended to the first hole, and the second trench includes a third end extended to the second portion of the first groove, and a fourth end extended to the second hole.

6. The display panel of claim 5, wherein the display elements of one of the columns are disposed between the first hole and the second hole.

7. The display panel of claim 3, further comprising an organic encapsulation layer, at least a portion of which is buried in the first groove and the trench.

8. The display panel of claim 3, further comprising a second dam disposed in the strip portion and surrounding the first dam, wherein a second groove is located between the first dam and the second dam and surrounds the first dam along the second dam.

9. The display panel of claim 8, wherein a third groove is extended to the first groove and the second groove.

10. The display panel of claim 9, wherein the trench and the third groove are located on a same line.

11. The display panel of claim 9, wherein the first dam comprises a plurality of sub-dams spaced apart from each other, and the third groove is located between the plurality of sub-dams.

12. The display panel of claim 9, further comprising an organic encapsulation layer, at least a portion of which is buried in the first groove, the second groove, the third groove, and the trench.

13. The display panel of claim 1, wherein a width of the central portion in the second direction is greater than a length of the trench in the second direction.

14. The display panel of claim 1, wherein the trench is provided in plural to include a plurality of trenches, and the display elements of one of the rows are disposed between the plurality of trenches.

15. The display panel of claim 1, wherein the strip portion is provided in plural to include a plurality of strip portions, and the plurality of strip portions is spaced apart from each other.

16. A display device comprising:

a display panel; and a cover window covering the display panel, wherein the display panel comprises:

a substrate in which a main display area and a corner display area which is adjacent to a corner of the main display area and bent with a preset radius of curvature are defined, the substrate including a strip portion disposed in the corner display area and extending from the corner of the main display area in a first direction;

a central portion disposed in the strip portion; and display elements arranged in a matrix in the first direction and a second direction crossing the first direction, in the central portion, and wherein a trench is located between rows of the display elements in the central portion and extends in the second direction.

17. The display device of claim 16, wherein the display panel further comprises a first dam disposed in the strip portion and surrounding at least a portion of the central portion, wherein a first groove is located between the central portion and the first dam and surrounds at least a portion of the central portion along the first dam, and the trench extends from the first groove in the second direction.

18. The display device of claim 17, wherein the trench comprises a first trench and a second trench alternately defined with each other, the first groove comprises a first portion and a second portion facing each other in the second direction, the first trench extends from the first portion of the first groove, and the second trench extends from the second portion of the first groove.

19. The display device of claim 17, wherein the display panel further comprises an organic encapsulation layer, at least a portion of which is buried in the first groove and the trench.

20. The display device of claim 17, wherein the display panel further comprises a second dam disposed in the strip portion and surrounding the first dam, and wherein a second groove is located between the first dam and the second dam and surrounds the first dam along the second dam.

21. The display device of claim 20, wherein a third groove is extended to the first groove and the second groove and located on a same line as the trench.

22. The display device of claim 21, wherein the display panel further comprises an organic encapsulation layer, at least a portion of which is buried in the first groove, the second groove, the third groove, and the trench.

23. The display device of claim 16, wherein the strip portion is provided in plural to include a plurality of strip portions, and the plurality of strip portions is spaced apart from each other.

* * * * *